United States Patent
Kim et al.

(10) Patent No.: US 10,861,891 B2
(45) Date of Patent: Dec. 8, 2020

(54) IMAGE SENSOR AND METHOD FOR FABRICATING THE SAME

(71) Applicant: Samsung Electronics Co., Ltd., Suwon-si (KR)

(72) Inventors: Bum Suk Kim, Hwaseong-si (KR); Yun Ki Lee, Hwaseong-si (KR); Jung-Saeng Kim, Seoul (KR); Jong Hoon Park, Seoul (KR); Jun Sung Park, Hwaseong-si (KR); Chang Rok Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/750,160

(22) Filed: Jan. 23, 2020

(65) Prior Publication Data
US 2020/0176497 A1 Jun. 4, 2020

Related U.S. Application Data

(60) Division of application No. 16/675,631, filed on Nov. 6, 2019, which is a continuation of application No.
(Continued)

(30) Foreign Application Priority Data

Jan. 23, 2018 (KR) ........................ 10-2018-0008187

(51) Int. Cl.
*H01L 27/146* (2006.01)
*H04N 5/378* (2011.01)
(Continued)

(52) U.S. Cl.
CPC .... *H01L 27/14623* (2013.01); *H01L 27/1462* (2013.01); *H01L 27/1463* (2013.01);
(Continued)

(58) Field of Classification Search
CPC ......... H01L 27/14623; H01L 27/14645; H01L 27/14685; H01L 27/14607; H01L 27/1462;
(Continued)

(56) References Cited

U.S. PATENT DOCUMENTS 9,524,998 B2 12/2016 Kim
9,842,874 B2 12/2017 Nakata
(Continued)

FOREIGN PATENT DOCUMENTS

JP 2015-026675 A 2/2015
KR 10-2006-0077149 A 7/2006
(Continued)

*Primary Examiner* — Karen Kusumakar
(74) *Attorney, Agent, or Firm* — Harness, Dickey & Pierce, P.L.C.

(57) ABSTRACT

An electronic device may include a photoelectric element, a shielding layer on the photoelectric element, and a color filter structure on the shielding layer. The shielding layer may define a first opening over the photoelectric element. The color filter structure may define a second opening over the photoelectric element and the first opening. The color filter structure may appear dark from a view facing the color filter structure.

19 Claims, 32 Drawing Sheets

Related U.S. Application Data

16/025,355, filed on Jul. 2, 2018, now Pat. No. 10,515,992.

(51) Int. Cl.
   *G06K 9/00* (2006.01)
   *H04N 5/376* (2011.01)
   *H04N 5/357* (2011.01)

(52) U.S. Cl.
   CPC .... *H01L 27/1464* (2013.01); *H01L 27/14605* (2013.01); *H01L 27/14607* (2013.01); *H01L 27/14621* (2013.01); *H01L 27/14627* (2013.01); *H01L 27/14645* (2013.01); *H01L 27/14685* (2013.01); *G06K 9/001* (2013.01); *G06K 9/0004* (2013.01); *H04N 5/3575* (2013.01); *H04N 5/378* (2013.01); *H04N 5/3765* (2013.01)

(58) Field of Classification Search
   CPC ........... H01L 27/1463; H01L 27/14627; H01L 27/14621; H04N 5/3575; H04N 5/3765; H04N 5/378; G06K 9/001; G06K 9/0004
   See application file for complete search history.

(56) References Cited

U.S. PATENT DOCUMENTS

| | | |
|---|---|---|
| 2002/0125408 A1 | 9/2002 | Hosier et al. |
| 2006/0076636 A1* | 4/2006 | Fukunaga ......... H01L 27/14625 257/432 |
| 2010/0157117 A1 | 6/2010 | Wang |
| 2010/0177205 A1 | 7/2010 | Shimoda et al. |
| 2012/0025199 A1 | 2/2012 | Chen et al. |
| 2016/0013233 A1* | 1/2016 | Noudo ................. H04N 5/3696 250/208.1 |
| 2016/0172399 A1* | 6/2016 | Nakata ............. H01L 27/14641 348/308 |
| 2017/0053969 A1 | 2/2017 | Roh et al. |

FOREIGN PATENT DOCUMENTS

| | | |
|---|---|---|
| KR | 10-0749271 B1 | 8/2007 |
| KR | 10-1053718 B1 | 8/2011 |
| KR | 10-2013-0033830 A | 4/2013 |
| KR | 10-2015-0141035 A | 12/2015 |
| KR | 10-2017-0022177 A | 3/2017 |
| WO | WO-2015/011900 A1 | 1/2015 |

* cited by examiner

IMAGE SENSOR AND METHOD FOR FABRICATING THE SAME

This application is a divisional of U.S. application Ser. No. 16/675,631, filed on Nov. 6, 2019, which is a continuation of U.S. application Ser. No. 16/025,355, filed Jul. 2, 2018, which claims priority from Korean Patent Application No. 10-2018-0008187, filed on Jan. 23, 2018 in the Korean Intellectual Property Office, the disclosure of each of which is incorporated herein by reference in its entirety.

BACKGROUND

1. Field of the Disclosure

The present disclosure relates to an image sensor and/or a method for fabricating the same.

2. Description of Related Art

Among semiconductor devices, an image sensor is an element that converts an optical image into an electrical signal. Image sensors may be classified as a charge coupled device (CCD) image sensor and a complementary metal oxide semiconductor (CMOS) image sensor. A CMOS image sensor may be abbreviated as a CIS (CMOS image sensor). The CIS may include a plurality of pixels arranged two-dimensionally. Each of the pixels may include a photodiode. The photodiode may convert incident light into an electrical signal.

Recently, as the computer industry and the communications industry has evolved, the demand for image sensors with improved performance has increased for a variety of applications such as a digital camera, a camcorder, a personal communication system (PCS), a game device, a surveillance camera, a medical micro camera and a robot. In addition, as semiconductor devices have become highly integrated, image sensors may also become highly integrated.

SUMMARY

Some aspects of the present disclosure provide an image sensor that looks dark (e.g., black) from the outside by reducing the reflection of incident light.

Some aspects of the present disclosure provide a method for fabricating an image sensor that looks dark (e.g., black) from the outside by reducing the reflection of incident light.

According to some example embodiments, an electronic device may include a photoelectric element, a shielding layer on the photoelectric element, and a color filter structure on the shielding layer. The shielding layer may define a first opening over the photoelectric element. The color filter structure may define a second opening over the photoelectric element and the first opening.

According to some example embodiments, an electronic device may include a photoelectric element, a shielding layer on the photoelectric element, and a color filter structure on the shielding layer. The shielding layer may define a first opening over the photoelectric element. The color filter structure may include at least a first color filter for filtering a first color and a second color filter layer for filtering a second color. The second color may be different than the first color. The second color filter layer may be on the first color filter layer. The first color filter may define a second opening over the first opening. The second color filter may define a third opening over the second opening. A size of the second opening may be greater than a size of the first opening and less than a size of the third opening.

According to some example embodiments, an electronic device may include a photoelectric element and a color filter structure on the photoelectric element. The color filter structure may include a first color filter layer, a second color filter layer, and a third color filter layer that are different colors. The first color filter layer may define a first opening over the photoelectric element. The second color filter layer may define a second opening over the first opening. The third color filter layer may define a third opening over the second opening. A size of the second opening may be greater than a size of the first opening and less than a size of the third opening.

According to some example embodiments, an image sensor may include a sensor array including a plurality of photoelectric elements arranged in a plurality of pixels, a shielding layer on the sensor array, and a color filter structure on the shielding layer. Each one of the plurality of pixels may include a corresponding one of the plurality of photoelectric elements. The shielding layer may define a plurality of first openings over the plurality of photoelectric elements, respectively. The color filter structure may define a plurality of second openings. Each one of the plurality of second openings may be arranged over a corresponding one of the plurality of first openings.

It should be noted that features and/or effects of inventive concepts are not limited those discussed above, and other features and/or effects of inventive concepts will be apparent to those skilled in the art from the following description.

BRIEF DESCRIPTION OF THE DRAWINGS

The above and other aspects and features of inventive concepts will become more apparent by describing non-limiting embodiments of inventive concepts with reference to the attached drawings, in which.

DETAILED DESCRIPTION

Hereinafter, a fingerprint sensing system including an image sensor according to some example embodiments of inventive concepts will be described with reference to FIGS. 1 and 2.

Figure 1:
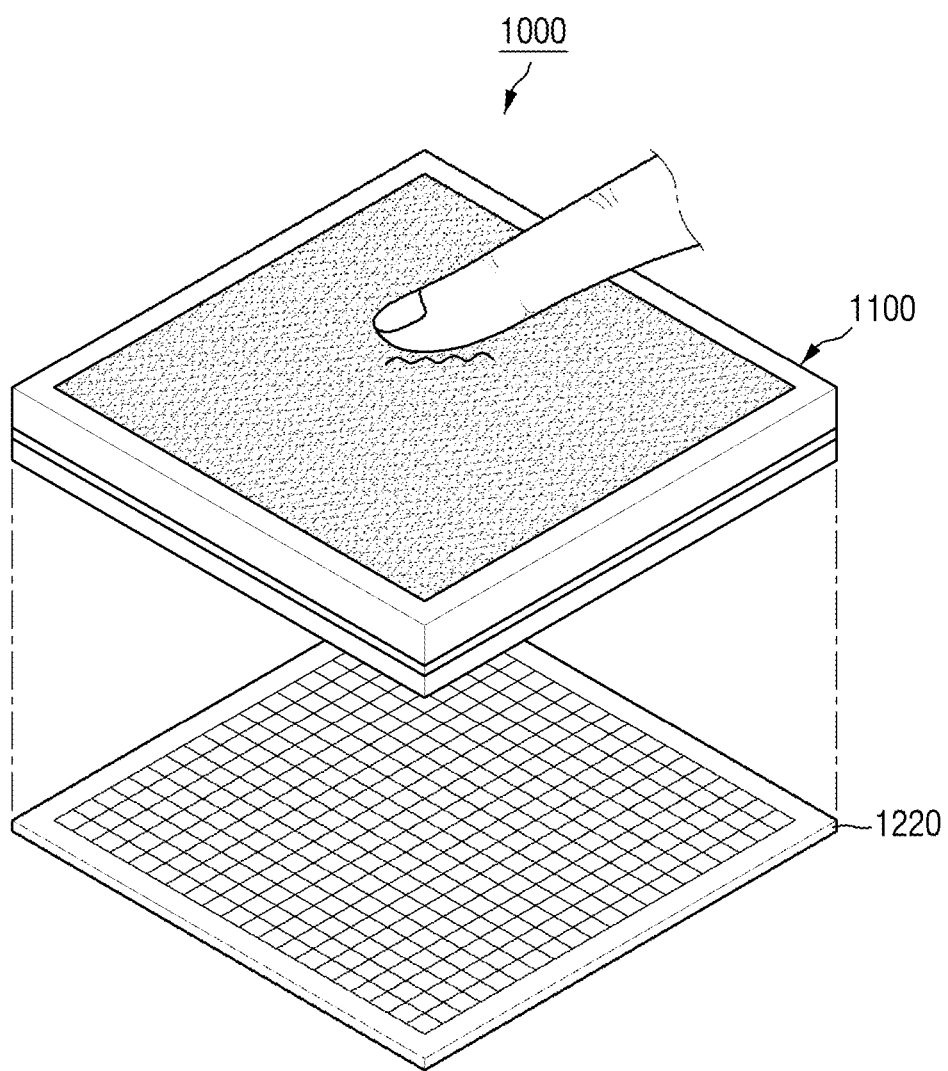
FIG. 1 is a perspective view illustrating a fingerprint sensing system including an image sensor according to some example embodiments of inventive concepts.

FIG. 1 is a perspective view illustrating a fingerprint sensing system including an image sensor according to some example embodiments of inventive concepts. FIG. 2 is a perspective view for illustrating a display panel of FIG. 1 in detail.

Figure 2:
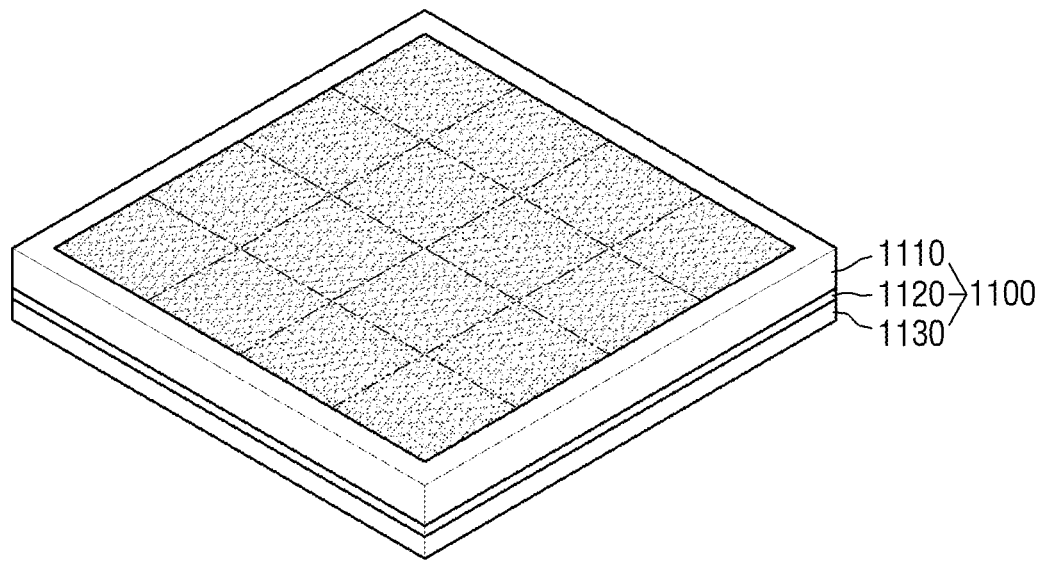
FIG. 2 is a perspective view for illustrating a display panel of FIG. 1 in detail.

Referring to FIGS. 1 and 2, a fingerprint sensing system 1000 may include a display panel 1100 and an image sensor 1220. The image sensor 1220 shown in FIG. 1 may be of an optical fingerprint sensor that recognizes a fingerprint by sensing light reflected off ridges and valleys between the ridges of the fingerprint.

Any of a variety of types of display panels may be employed as the display panel 1100. According to some example embodiments of inventive concepts, the display panel 1100 may be an OLED (organic light-emitting diode) display panel that includes an OLED layer 1120 having OLEDs formed thereon, which emit light having one or more colors to display images.

It is, however, to be understood that this is merely illustrative. The fingerprint sensing system 1000 may be any of a variety of types of display panels, such as an LCD display panel displaying images using an ordinary backlight unit or OLEDs. Besides the OLED display panel and the LCD display panel described above, any display panel may be employed as the display panel 1100 as long as light from a light source of the display panel is reflected off a fingerprint and then is transmitted toward a back plane of the display panel 1130 (or toward the image sensor 1200).

In some embodiments, the display panel 1100 may include a cover glass 1110, an OLED layer 1120, and a panel back plane 1130.

The cover glass 1110 may be the top of the display panel 1100 on which a user's finger is touched. A user's fingerprint may be input to the display panel through the cover glass 1110.

The OLED layer 1120 may be disposed under the cover glass 1110. The OLED layer 1120 may emit light. The light emitted by the OLED layer 1120 may be reflected by the fingerprint placed on the cover glass 1110 and transmitted to the image sensor 1220.

The panel back plane 1130 may be disposed under the OLED layer 1120. The panel back plane 1130 may transmit the light reflected by the fingerprint. An image sensor 1220 may be attached under the panel back plane 1130.

The image sensor 1220 may be implemented as a semiconductor chip or as a semiconductor package and attached to a side of the display panel 1100. In some embodiments, the image sensor 1220 may be attached to the lower surface of the panel back plane 1130. According to some example embodiments of inventive concepts, the image sensor 1220 may be implemented as a semiconductor layer or as a semiconductor chip in which a plurality of photoelectric transformation elements (for example, a photodiode, a phototransistor, a photogate, and a pinned photodiode) is formed. According to some example embodiments of inventive concepts, the image sensor 1220 may be a semiconductor layer in which an image sensor such as a CIS (CMOS image sensor) or a CCD (charge coupled device) is formed. In the following description, it is assumed that the photoelectric transform element in the image sensor 1220 is implemented as a photodiode.

The image sensor 1220 senses a fingerprint that is on or proximate to the display panel 1100. In the fingerprint sensing system 1000 according to example embodiments of inventive concepts, a fingerprint placed on the display of a wearable device such as a smart phone can be recognized without requiring a separate button for recognizing a fingerprint. For example, if the display panel 1100 is an OLED display panel, when a user's fingerprint is placed on the cover glass 1110 of the display panel 1100, the OLED layer 1120 in the display panel 1100 works as a light source, so that light emitted from the OLED layer 1120 is transmitted toward and reflected off the user's fingerprint, and then the reflected light passes through the panel back plane 1130 to be transmitted to the image sensor 1220.

The image sensor 1220 includes a plurality of pixel regions. Different pixel regions sense light reflected off different parts of the fingerprint and generate electrical signals corresponding to the sensed light. Each of the pixel regions may generate an electrical signal corresponding to light reflected off a ridge of the fingerprint or may generate an electrical signal corresponding to light reflected off a valley between ridges. The amount of light sensed by a photodiode may vary depending on the type of the fingerprint off which the light is reflected. An electric signal having different levels may be generated depending on the amount of the sensed light.

Each of the electric signals from the plurality of pixel regions may include brightness information (and/or image information). By processing the electric signals, it is possible to determine whether a part of the fingerprint corresponding to each pixel region is a ridge or a valley. A complete fingerprint image can be constructed by combining the determined information pieces.

Although the fingerprint sensing system 1000 may be used to sense the fingerprint of a user, inventive concepts are not limited thereto. For example, when an object is placed on the display panel 1100, the image sensor 1220 may sense the light reflected off the object and generate the sensing result. When each fingerprint pixel of the image sensor 1220 is obtained as a result of sensing image data, the image of the object located on the display panel 1100 can be reconstructed using the image data from each fingerprint pixel of the image sensor 1220.

Hereinafter, image sensors according to some example embodiments of inventive concepts will be described with reference to FIGS. 3 to 8.

Figure 3:
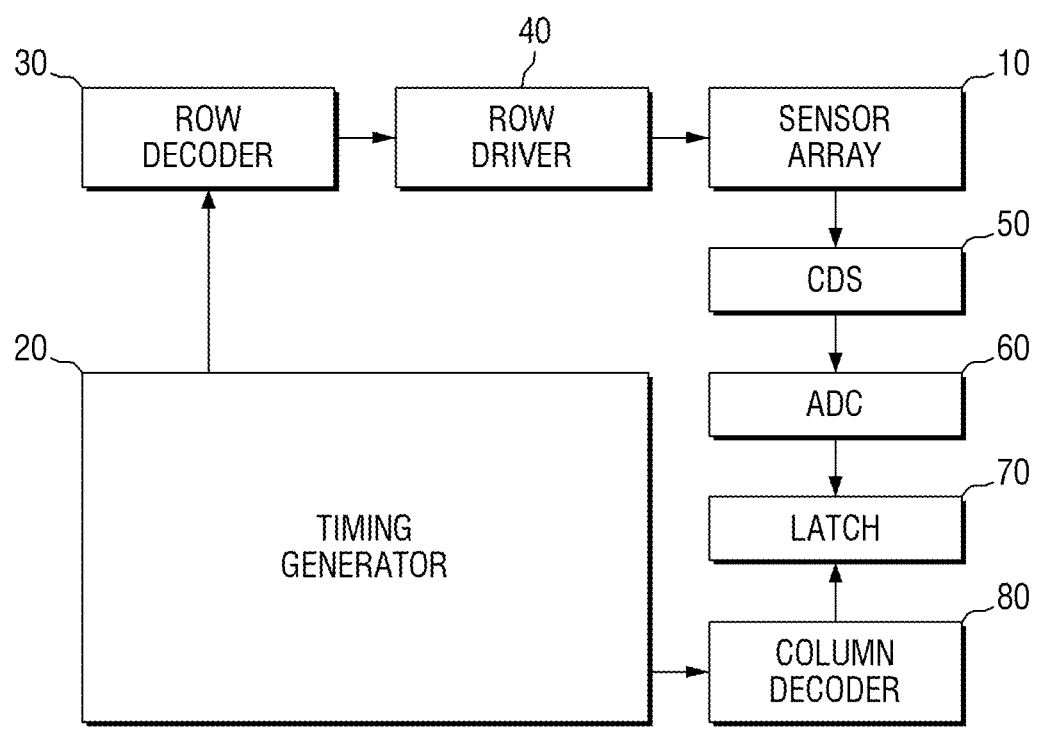
FIG. 3 is a block diagram of an image sensor according to some example embodiments of inventive concepts.
Figure 4:
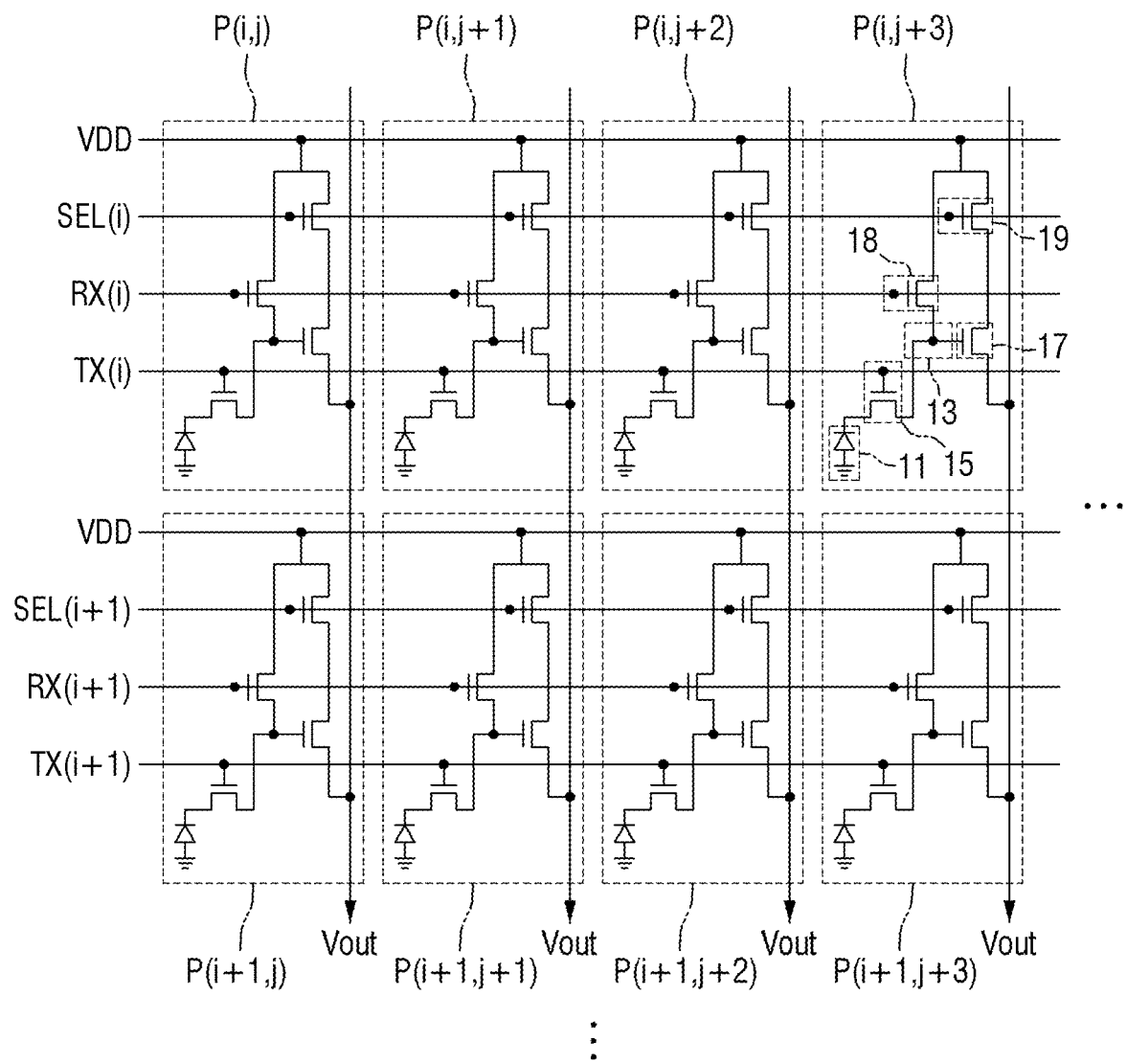
FIG. 4 is an equivalent circuit diagram of a sensor array of FIG. 3.
Figure 5:
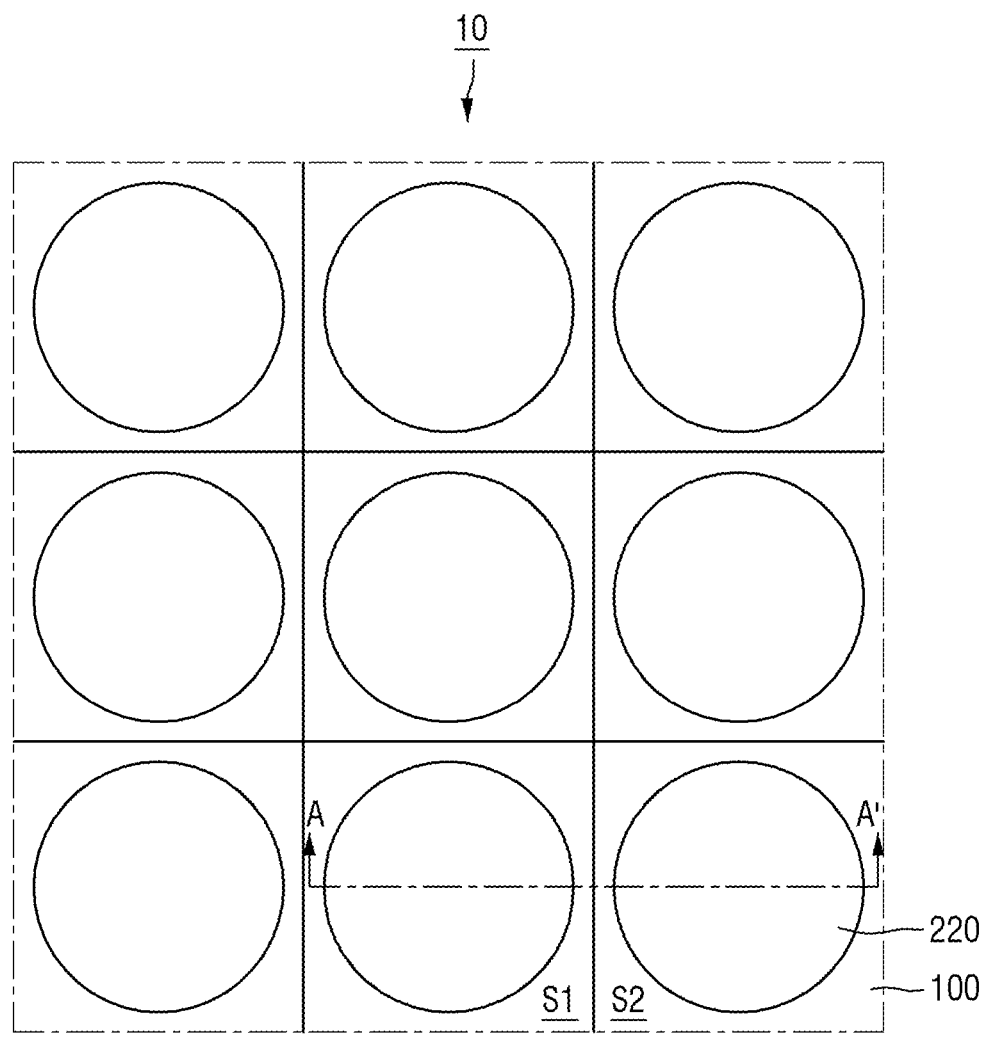
FIG. 5 is a plan view of a part of the sensor array of FIG. 3.

FIG. 3 is a block diagram of an image sensor according to some example embodiments of inventive concepts. FIG. 4 is an equivalent circuit diagram of a sensor array of FIG. 3. FIG. 5 is a plan view of a part of the sensor array of FIG. 3. FIGS. 6A, 6B, 6C, and 6D are cross-sectional views taken along line A-A' of FIG. 5 for image sensors according to some example embodiments. FIG. 7A is an enlarged view of portion B1 of FIG. 6A. FIG. 7B is an enlarged view of portion B1 of FIG. 6B. FIG. 7C is an enlarged view of portion B1 of FIG. 6C. FIG. 8 is a view for conceptually illustrating guide paths of incident light of FIG. 7A.

Referring to FIG. 3, an image sensor 1220 according to some example embodiments of inventive concepts includes a sensor array 10 in which pixels each including a photoelectric element are arranged two-dimensionally, a timing generator 20, a row decoder 30, a row driver 40, a correlated double sampler (CDS) 50, analog-to-digital converter (ADC) 60, a latch 70, a column decoder 80, and the like.

The sensor array 10 includes a plurality of pixel units arranged two-dimensionally. The pixel units serve to convert an optical image into an electrical output signal. The sensor array 10 is driven by receiving driving signals such as a row selection signal, a reset signal, and a charge transfer signal from the row driver 40. In addition, the converted electrical output signal may be provided to the correlated double sampler 50 via a vertical signal line.

The timing generator 20 provides a timing signal and a control signal to the row decoder 30 and the column decoder 80.

The row driver 40 provides driving signals for driving the plurality of pixel units to the sensor array 10 in response to the decoding by the row decoder 30. Typically, when pixel units are arranged in a matrix, a driving signal is provided row-by-row.

The correlated double sampler 50 receives the output signals formed in the sensor array 10 via the vertical signal lines and holds and samples them. That is, the correlated double sampler 150 may perform sampling by taking two samples of a certain noise level and the signal level of the output signal, and output a difference level corresponding to the difference between the noise level and the signal level.

The analog-to-digital converter 60 converts the analog signal corresponding to the difference level into a digital signal to output it.

The latch 70 latches the digital signal, and the latched signal is output to an image signal processor sequentially in response to the decoding by the column decoder 80.

Referring to FIG. 4, the pixels P are arranged in a matrix to form the sensor array 10. Each of the pixels P includes a photoelectric transistor 11, a floating diffusion region 13, a charge transfer transistor 15, a drive transistor 17, a reset transistor 18, and a selection transistor 19. Their functionality will be described with respect to the pixels P(i, j), P(i, j+1), P(i, j+2), P(i, j+3), . . . arranged in the $i^{th}$ row.

The photoelectric transistor 11 absorbs incident light and accumulates electric charges in proportion to the amount of light. As the photoelectric transistor 11, a photodiode, a phototransistor, a photogate, a pinned photodiode, or a combination thereof may be employed. FIG. 4 shows an example where the photoelectric transistor 11 is a photodiode.

Each photoelectric transistor 11 is coupled to the respective charge transfer transistor 15 for transferring the accumulated charges to the floating diffusion region 13. The floating diffusion region 13 converts the charges into a voltage, and has a parasitic capacitance so that the charges are stored cumulatively.

The drive transistor 17 illustrated as the source follower amplifier amplifies a change in the electrical potential of the floating diffusion region 13 that receives the charges accumulated in each photoelectric transistor 11 and outputs it via the output line Vout.

The reset transistor 18 periodically resets the floating diffusion region 13. The reset transistor 18 may be implemented as a single MOS transistor driven by a bias provided via a reset line RX(i) that applies a predetermined bias (e.g., a reset signal). When the reset transistor 18 is turned on by the bias provided via the reset line RX(i), an electrical potential, e.g., supply voltage VDD, provided to the drain of the reset transistor 18 is transmitted to the floating diffusion region 13.

The selection transistor 19 serves to select pixels P arranged in a row which are to be read. The selection transistor 19 may be implemented as a signal MOS transistor driven by a bias (e.g., a row selection signal) provided via a row selection line SEL(i). When the selection transistor 19 is turned on by the bias provided via the row selection line SEL(i), an electrical potential, e.g., the supply voltage VDD, provided to the drain of the selection transistor 19 is transmitted to the drain region of the drive transistor 17.

The transfer line TX(i) for applying a bias to the charge transfer transistor 15, the reset line RX(i) for applying a bias to the reset transistor 18, and the selection line SEL(i) for applying a bias to the selection transistor 19 may be extended substantially in parallel with one another in the row direction.

Referring to FIG. 5, the sensor array 10 may include a plurality of pixel regions, and the plurality of pixel regions may be arranged in rows and columns when viewed from the top. The plurality of pixel regions may include a first pixel region S1 and a second pixel region S2.

In FIG. 5, only a part of the sensor array 10, e.g., only nine pixel regions are shown. However, this is merely illustrative, and the number of pixel regions is not particularly limited.

The plurality of pixel regions including the first pixel region S1 and the second pixel region S2 may have the same size and shape. The pixel regions may be separated from one another by an isolation layer.

In each of the pixel regions, a signal microlens 220 may be formed. Accordingly, the microlens 220 may also be arranged in rows and columns, like the pixel regions.

Figure 6A:
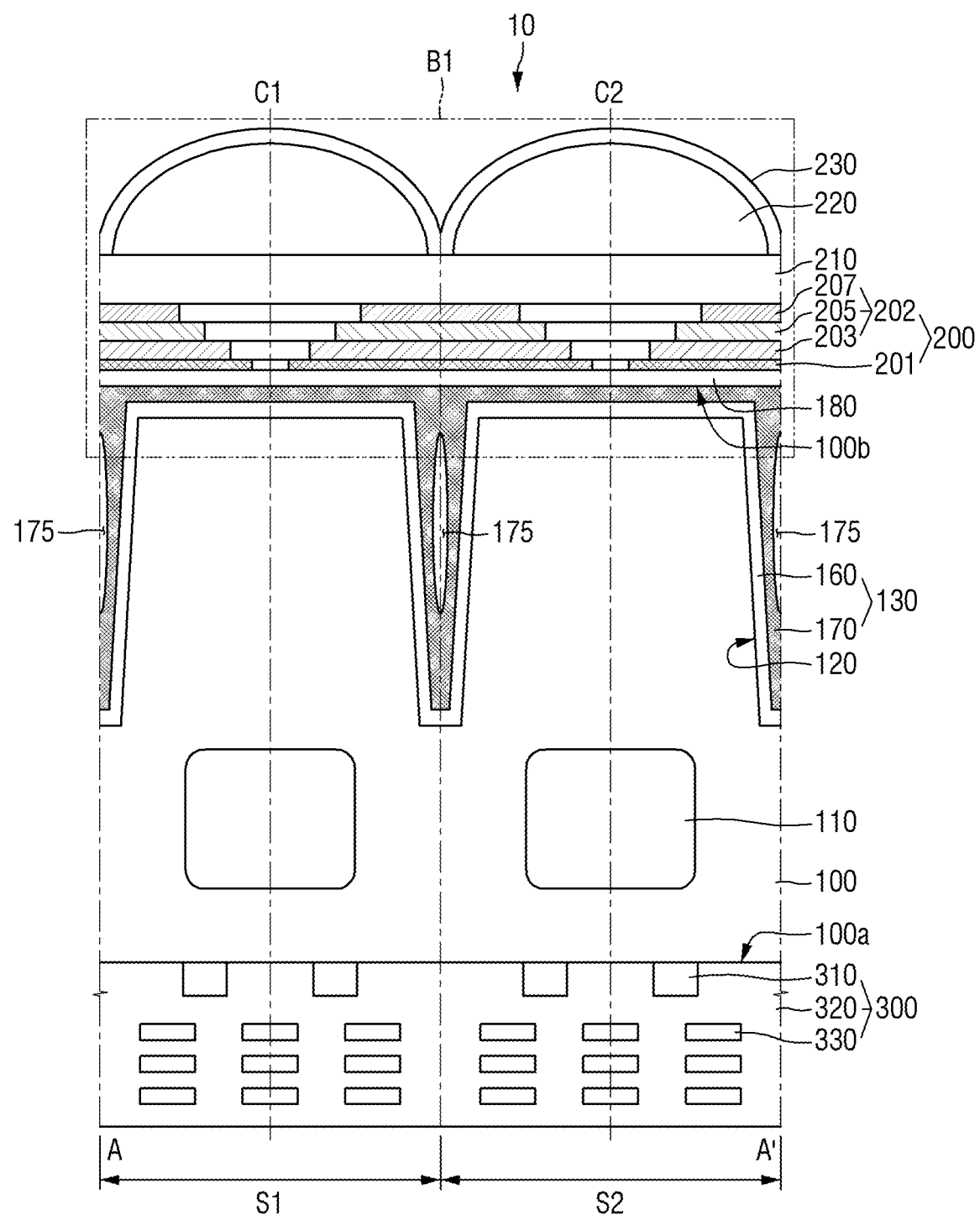
FIGS. 6A, 6B, 6C and 6D are cross-sectional views taken along line A-A' of FIG. 5.
Figure 7A:
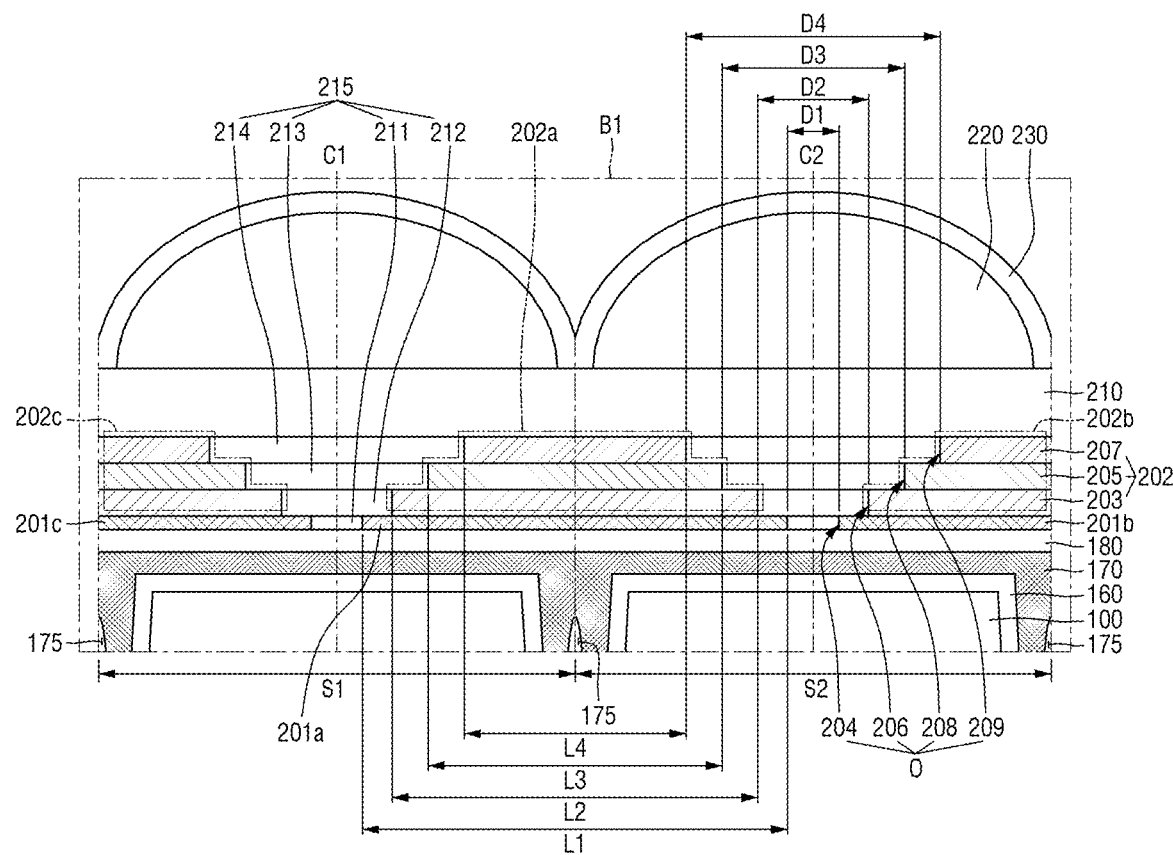
FIG. 7A is an enlarged view of portion B1 of FIG. 6A.
Figure 7B:
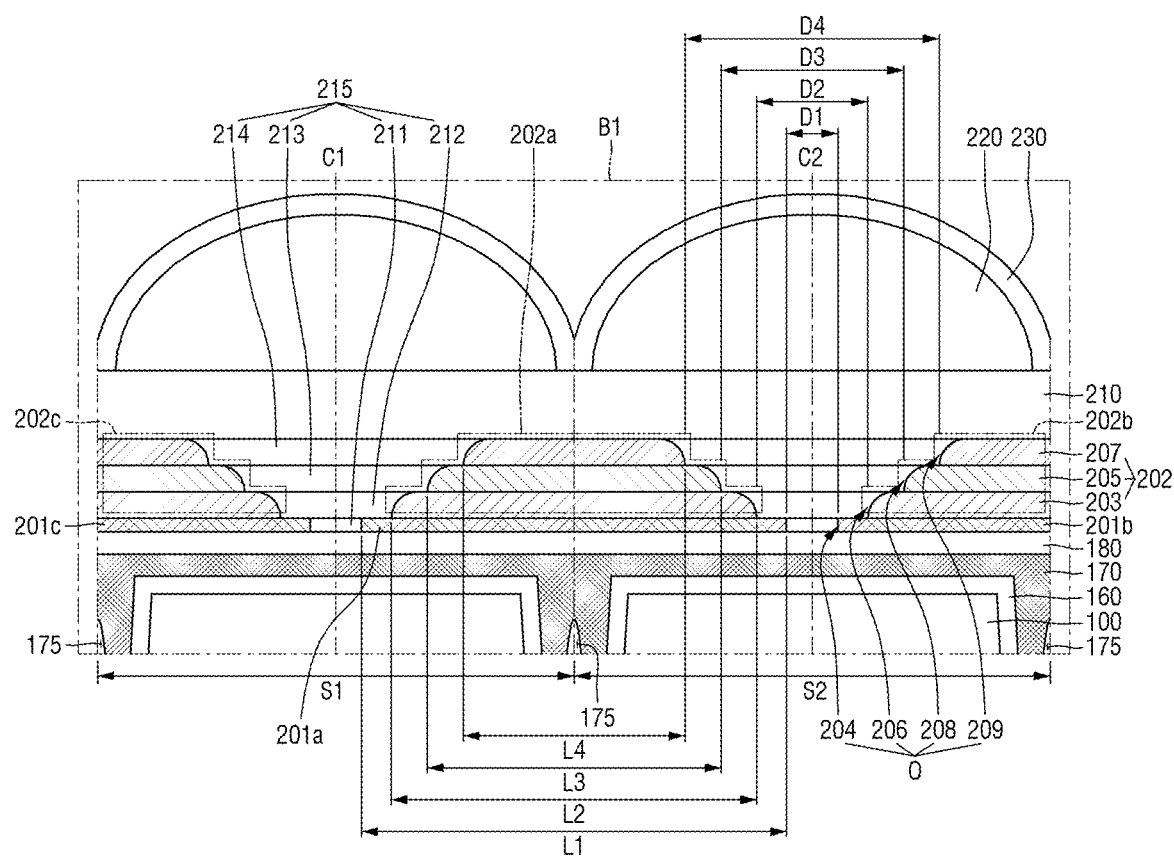
FIG. 7B is an enlarged view of portion B1 of FIG. 6B.
Figure 7C:
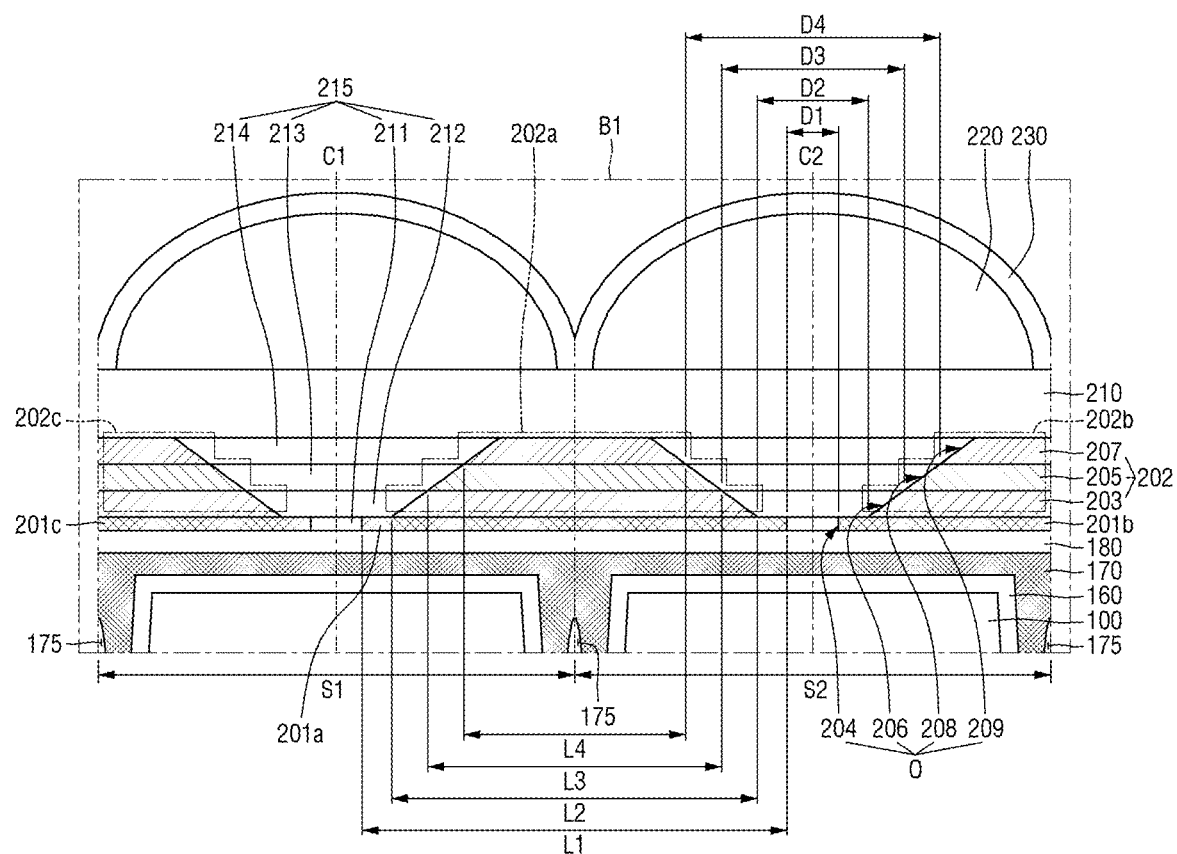
FIG. 7C is an enlarged view of portion B1 of FIG. 6C.
Figure 8:
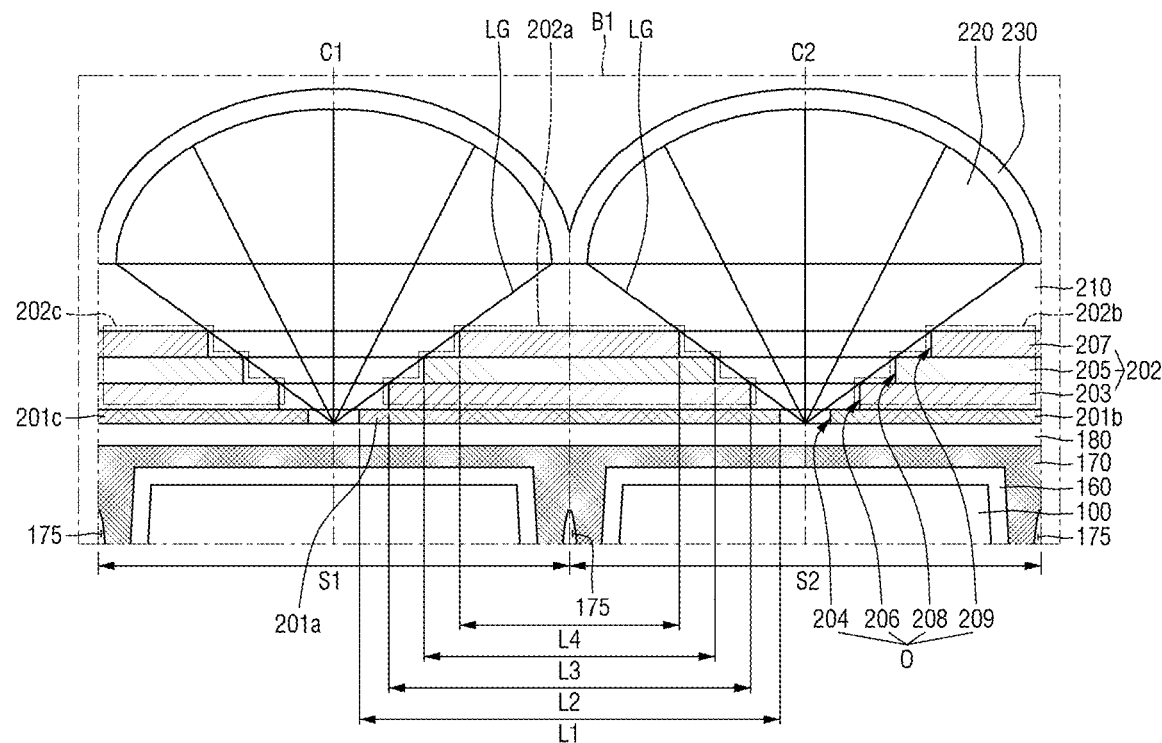
FIG. 8 is a view for conceptually illustrating guide paths of incident light of FIG. 7A.

Referring to FIGS. 6A and 7A, a sensor array 10 of an image sensor according to some example embodiments of inventive concepts includes a substrate 100, a photoelectric element 110, an isolation layer 130 including a fixed charge film 160 and an anti-reflection film 170, a lower planarization layer 180, a stack structure 200, an opening O, a filling layer 215, an upper planarization layer 210, a microlens 220, a protective layer 230, and an insulating structure 300. The anti-reflection film 170 may define at least one void 175. The isolation layer 130 may surround the photoelectric element 110.

Figure 6B:
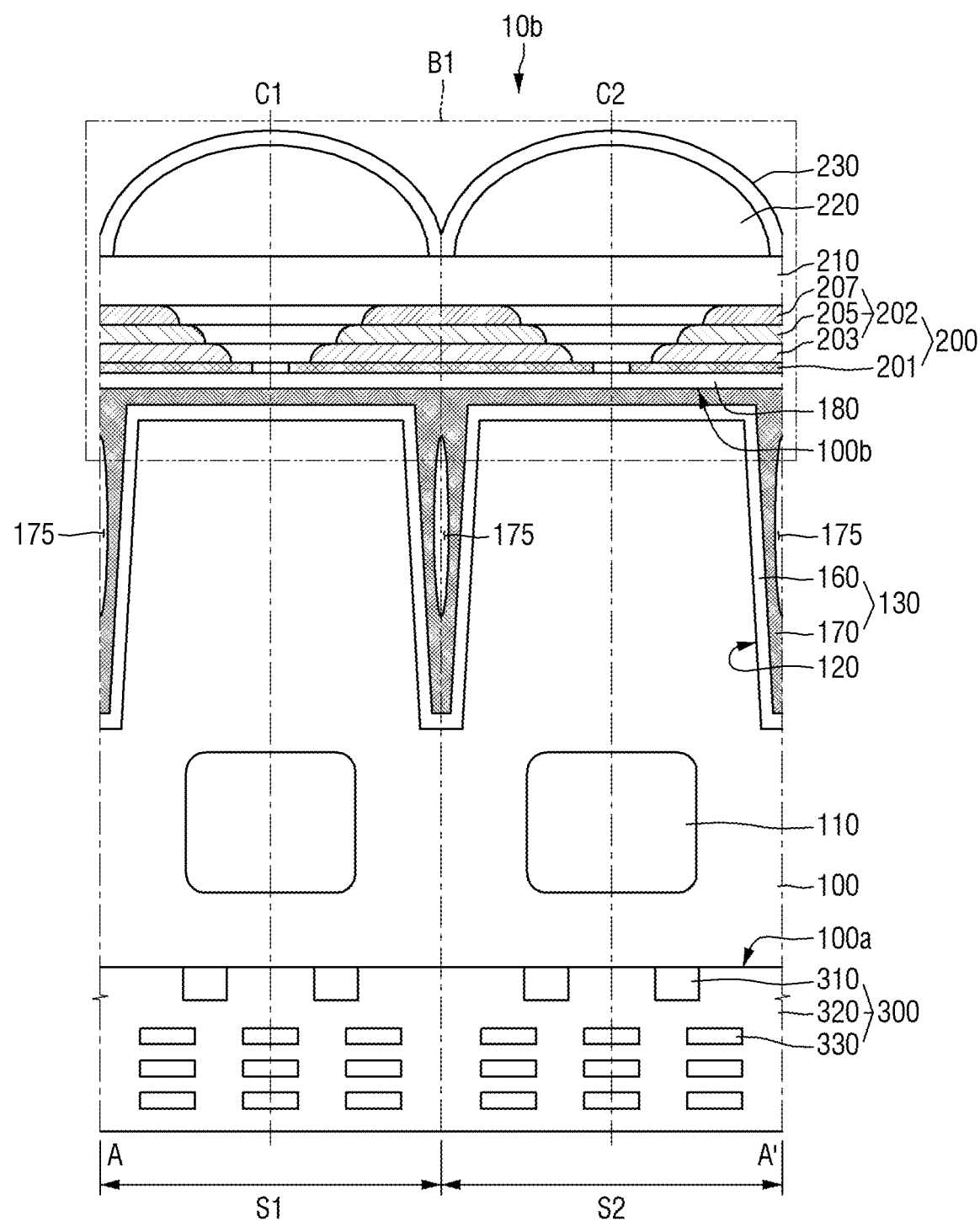

The stack structure may include a color filter structure 202 on a metal shield layer 201. The color filter structure 202 may include a first color layer 203, a second color layer 205, and a third color layer 207 stacked on top of each other. The first color layer 203, second color layer 205, and third color layer 207 may include vertical (e.g., straight) sidewalls that respectively define a second opening 206, a third opening 208, and a fourth opening 209. As shown in FIGS. 6B and 7B, a sensor array 10b of an image sensor according to some example embodiments of inventive concepts may be the same as the sensor array 10 of the image sensor in FIGS. 6A and 7A except the first color layer 203, second color layer 205, and third color layer 207 may include rounded (or curved) sidewalls for respectively defining the second to fourth openings.

Figure 6C:
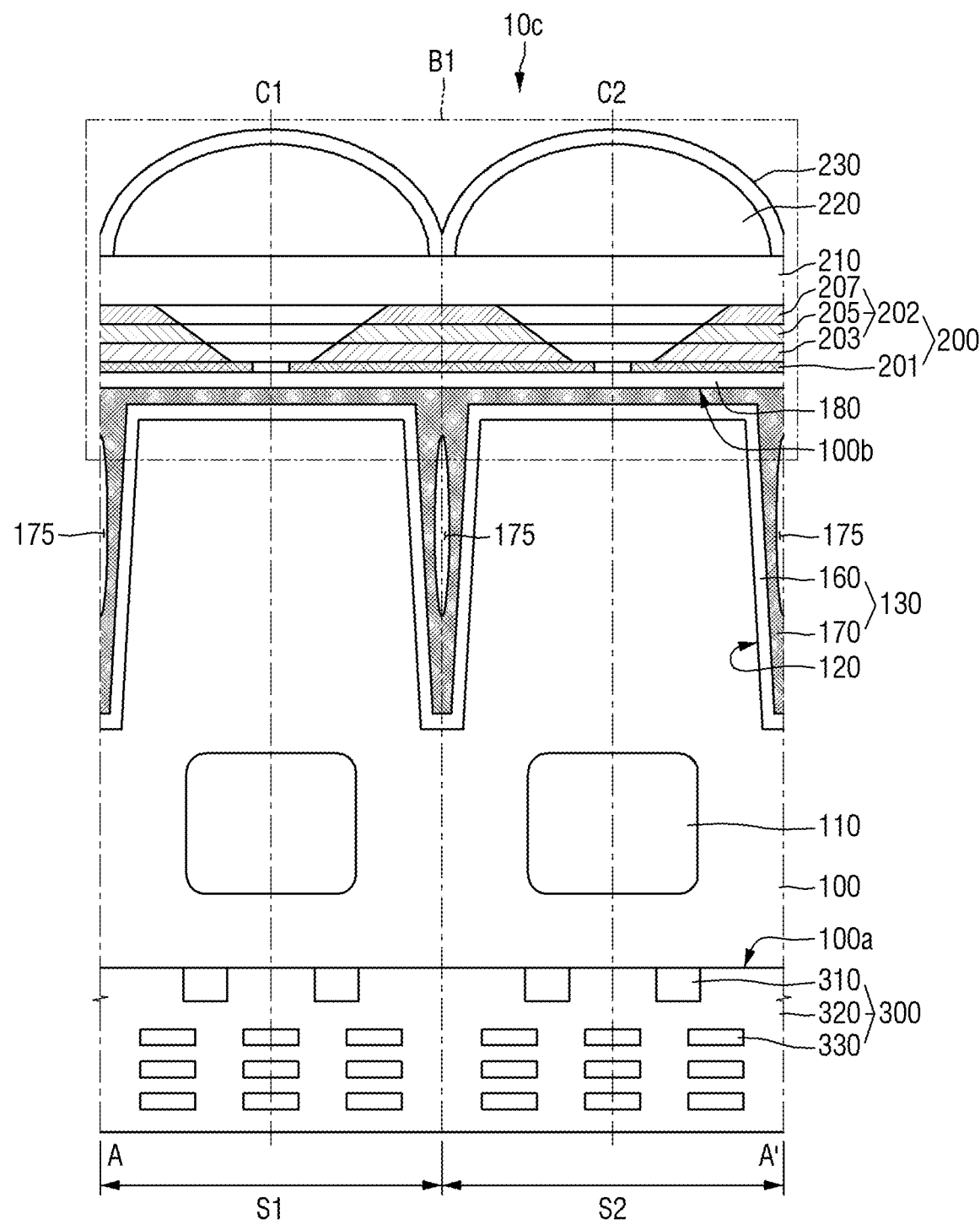

Alternatively, as shown in FIGS. 6C and 7C, a sensor array 10c of an image sensor according to some example embodiments of inventive concepts may be same as the sensor array 10 of the image sensor in FIGS. 6A and 7A except the first color layer 203, second color layer 205, and third color layer 207 may include tapered (e.g., inclined) sidewalls for respectively defining the second to fourth openings.

Hereinafter, except for where otherwise described, features that are the same as or similar between the sensor arrays 10, 10b, and 10c of the image sensors will be described with reference to FIGS. 6A and 7A, 6B and 7B, and 6C and 7C.

The substrate 100 includes a first surface 100a and a second surface 100b opposed to each other. The first surface 100a of the substrate 100 may be the front side of the substrate 100, while the second surface 100b of the substrate 100 may be the back side of the substrate 100. It is, however, to be understood that this is merely illustrative.

For example, the substrate 100 may be a p-type or n-type bulk substrate, a p-type bulk substrate on which a p-type or n-type epitaxial layer is grown, or an n-type bulk substrate on which a p-type or n-type epitaxial layer is grown. In addition, the substrate 100 may be an organic plastic substrate in addition to the semiconductor substrates.

The first pixel region S1 and the second pixel region S2 may be formed in the substrate 100. In each of the first pixel region S1 and the second pixel region S2, incident light coming from the outside via the microlens 220 is sensed. The first pixel region S1 and the second pixel region S2 may be defined by being separated by the isolation layer 130, which will be described later.

In the substrate 100 in each of the first pixel region S1 and the second pixel region S2, the photoelectric element 110, for example, a photodiode, is formed. The photoelectric element 110 may be formed adjacent to the first surface 100a of the substrate 100, for example.

The photoelectric element 110 may be the photoelectric transistor 11 of FIG. 4 described above, that is, a photodiode, a phototransistor, a photogate, a pinned photodiode, or a combination thereof. The photoelectric element 110 may be in a single pixel region of the substrate 100, such as the first pixel region S1 or second pixel region S2, and the color filter structure 202 may cover at least 70 percent of an area of the single pixel region.

The isolation layer 130 may be formed in the substrate 100. The isolation layer 130 may define the first pixel region S1 and the second pixel region S2 in the substrate 100. The isolation layer 130 may be formed at the edges of each of the first pixel region S1 and the second pixel region S2. Each of the first pixel region S1 and the second pixel region S2 may be defined as a closed space by the isolation layer 130. The isolation layer 130 may be a closed curve like a loop when viewed from the top.

The isolation layer 130 may be formed in an isolation trench 120. The isolation trench 120 may be formed by etching the substrate 100 in the depth direction. The isolation trench 120 may be formed from the second surface 100b of the substrate 100 and extended toward the first surface 100a. The isolation trench 120 may not reach the first surface 100a of the substrate 100.

The depth of the isolation trench 120 may be smaller than the depth at which the photoelectric element 110 is located. This may limit and/or prevent the photoelectric element from being damaged during a process of forming the isolation trench 120. It is, however, to be understood that this is merely illustrative. In some embodiments, the depth of the isolation trench 120 may extend in the substrate 100 to the same depth or deeper than the depth of the photoelectric element 110.

According to some example embodiments of inventive concepts, if the isolation trench 120 is formed sufficiently away from the photoelectric element 110 in the horizontal direction, the depth of the isolation trench 120 may be greater than the depth at which the photoelectric element 110 is located.

The side surfaces of the isolation trench 120 may be tapered as shown in FIG. 6A. In some embodiments, the width of the isolation trench 120 may become narrower toward the bottom and may become wider toward the top. It is, however, to be understood that this is merely illustrative.

As shown in the drawings, the isolation layer 130 may include a fixed charge film 160 and an anti-reflection film 170 formed on the fixed charge film 160 to be described later.

Figure 6D:
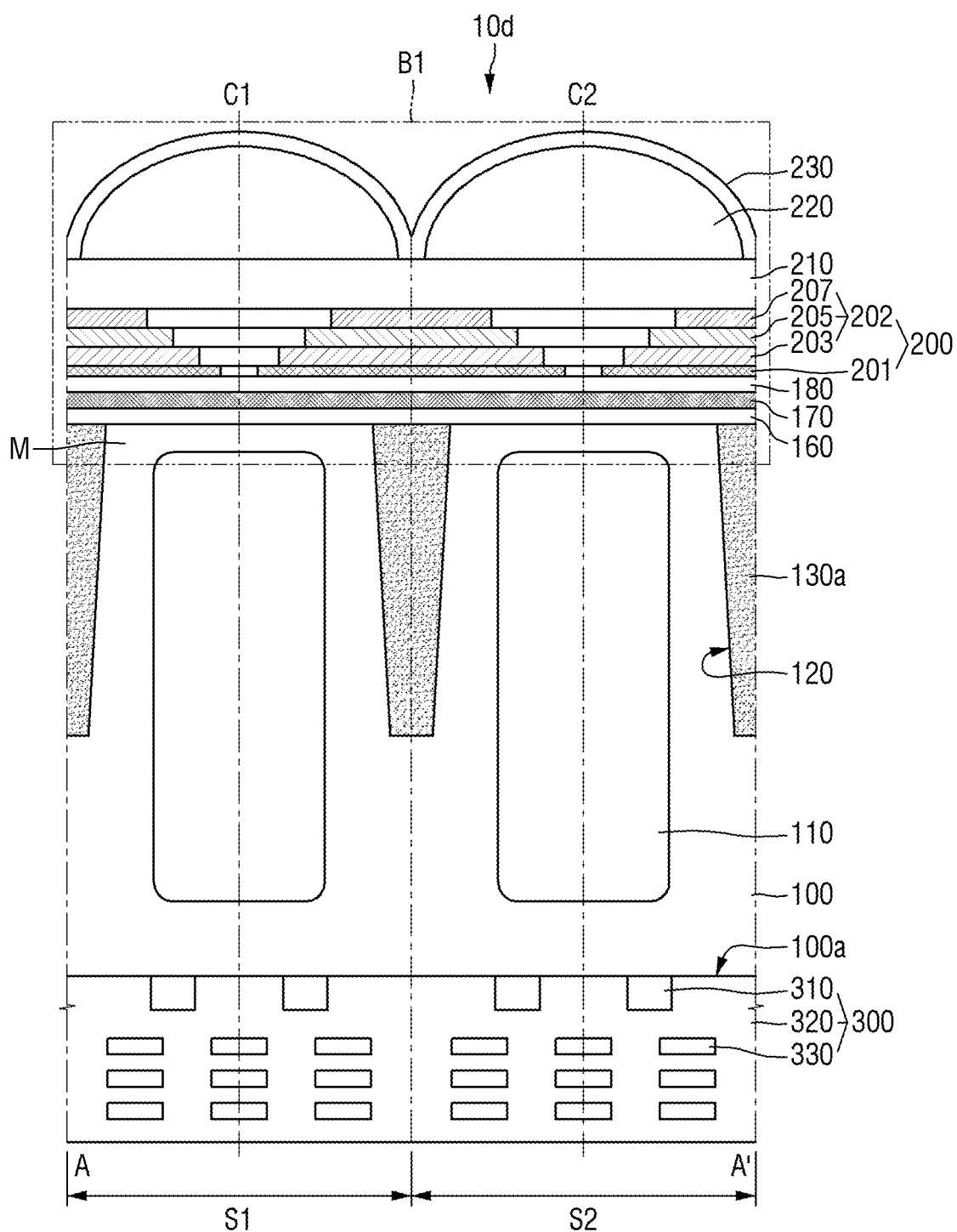

Alternatively, as shown in FIG. 6D, a sensor array 10d of an image sensor according to some example embodiments may be the same as the sensor array 10 of the image sensor in FIG. 6A, except for employing a different isolation layer and/or a different sized photoelectric element 110. As shown in FIG. 6D, a separate isolation layer 130a may be formed in the isolation trench 120 and the fixed charge film 160 and the anti-reflection film 170 may be formed on the isolation layer 130a. The anti-reflection film 170 may be between the photoelectric element 110 and the color filter structure 202. The isolation layer 130a may surround the photoelectric element 110. In some implementations, the fixed charge film 160 may be omitted from the image sensor. Although not illustrated, in some embodiments, the isolation layer 130a may define an air gap in the isolation trench 120, similar to the air gap 175 in FIGS. 6A to 6C.

The isolation layer 130a may include at least one of silicon oxide, silicon nitride, silicon oxynitride, and a low dielectric material having a lower dielectric constant than silicon oxide The low-k dielectric material may include, but is not limited to, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material or a combination thereof. The upper surface of the isolation layer 130a and the upper surface of the substrate 100 may be in the same plane. However, inventive concepts are not limited thereto.

Additionally, referring to FIG. 6D, in some example embodiments, the photoelectric element 110 element may extend into a mesa region M of the substrate 100. The mesa region M may be defined by the isolation layer 130a. A depth of the isolation layer 130a may be less than a thickness of the substrate 100. In some embodiments, a vertical thickness of the photoelectric element 110 may be greater than a depth of the isolation trench 120.

Although FIGS. 6A to 6D show that the isolation layer 130 defines the first pixel region S1 and the second pixel region S1, this is merely illustrative. Image sensors according to some example embodiments of inventive concepts may employ a structure in which no isolation layer is formed. Also in this instance, the incident light is guided by the metal shield layer 201 and the stack structure 200, and thus cross talk between pixel regions may not be large.

Referring to FIGS. 6A to 6C and 7A to 7C, the fixed charge film 160 may be formed on the second surface 100b of the substrate 100 and on the surfaces (side and bottom surfaces) of the isolation trench 120. The fixed charge film 160 may be formed on a part of or the entire second surface 100b of the substrate 100.

When the photoelectric element 110 formed in the pixel region, for example, the photodiode 11 (see FIG. 4) is of n-type, the fixed charge film 160 may be formed of a p+ type. That is to say, the fixed charge film 160 serves to reduce a dark current by reducing the electron-hole pairs (EHP) generated thermally on the second surface 100b of the substrate 100. In some implementations, the fixed charge film 160 may be eliminated.

The fixed charge film 160 may include, for example, a metal oxide layer or a metal nitride layer. The metal may be hafnium (Hf), aluminum (Al), zirconium (Zr), tantalum (Ta), and titanium (Ti). The fixed charge film 160 may include at least one of La, Pr, Ce, Nd, Pm, Sm, Eu, Gd, Tb, Dy, Ho, Tm, Yb, Lu or Y. Further, the fixed charge film 160 may be formed of a hafnium oxynitride layer or an aluminum oxynitride layer.

The fixed charge film 160 may be deposited by atomic layer deposition (ALD) to have a uniform thickness. Accordingly, the fixed charge film 160 may be formed along the side and bottom surfaces of the isolation trench 120 to conform to it.

Although the fixed charge film 160 is shown as a single layer in the drawings, it may have a stack structure in which two or more films formed of the same material or different materials are combined. For example, the fixed charge film 160 may have a double-layer structure including a first metal oxide layer formed along the side and bottom surfaces of the isolation trench 120, and a second metal oxide layer formed on the first metal oxide layer. The first metal oxide layer and the second metal oxide layer may include different metals. For example, the first metal oxide layer may include AlO, and the second metal oxide layer may include TaO. However, inventive concepts are not limited thereto.

The anti-reflection film 170 may be disposed on the fixed charge film 160. The isolation trench 120 may be filled with the anti-reflection film 170. The anti-reflection film 170 may be formed also on the second surface 100b of the substrate 100 along the surface of the fixed charge film 160.

The anti-reflection film 170 serves to limit and/or prevent reflection of incident light from the outside. The anti-reflection film 170 may include a material having a refractive index different from that of the fixed charge film 160. For example, the anti-reflection film 170 may be made of an insulating layer such as a silicon oxide layer, a silicon nitride layer, a silicon oxynitride layer, a resin, a combination thereof, or a stack thereof.

The double-layer structure of the fixed charge film 160 and the anti-reflection film 170 may have different refractive indices to thereby limit and/or prevent reflection. Therefore, it is possible to limit and/or prevent reflection of light incident on the second surface 100b of the substrate 100.

The material/thickness of the anti-reflection film 170 may vary depending on the wavelength of light used in a photolithography process. For example, the anti-reflection film 170 may be formed by stacking a silicon oxide layer having a thickness of approximately 50 to 200 Å and a silicon nitride layer having a thickness of approximately 300 to 500 Å. It is, however, to be understood that this is merely illustrative.

The void 175 may be formed inside the anti-reflection film 170. The void 175 may be formed depending on the gap fill capability of the material forming the anti-reflection film 170. In some embodiments, as the isolation trench 120 is narrow, if the anti-reflection film 170 fails to completely fill the isolation trench 120, the void 175 may be formed. Therefore, if the isolation trench 120 is broad enough or the gap fill capability of the material forming the anti-reflection film 170 is good enough, the void 175 may not be formed.

The lower planarization layer 180 may be formed on the anti-reflection film 170. The lower planarization layer 180 may include at least one of, for example, a silicon oxide series material, a silicon nitride series material, a resin, or a combination thereof.

The lower planarization layer 180 may be used as a buffer layer for limiting and/or preventing the substrate 100 from being damaged during a patterning process for forming a pad (not shown) in the non-pixel regions.

The lower planarization layer 180 may include at least one of a material of a silicon oxide layer, a material of a silicon nitride layer, a resin, or a combination thereof. For example, a silicon oxide layer having a thickness of approximately 3000 to 8000 Å may be used as the lower planarization layer 180. It is, however, to be understood that this is merely illustrative.

The stack structure 200 may be formed on the lower planarization layer 180. The stack structure 200 may define an opening O that exposes the upper surface of the lower planarization layer 180. The stack structure 200 may include the metal shield layer 201 and the color filter structure 202.

The metal shield layer 201 may be formed on the lower planarization layer 180. The metal shield layer 201 covers a part of the lower planarization layer 180 and exposes the remaining part. Accordingly, a first opening 204 may be defined.

The metal shield layer 201 may be seen as if a number of features separated from one another by the first opening 204 in the cross section of FIGS. 7A, 7B, and/or 7C. For example, as shown in FIG. 7A, the metal shield layer 201 may include a first metal shield layer 201a, a second metal shield layer 201b, and a third metal shield layer 201c.

Although the first to third metal shield layers 201a, 201b and 201c look as if they are separated from one another in the cross-sectional view, they may be connected to one another in the plane structure. That is, since the first opening 204 may be a circle in the plane structure, the first to third metal shield layers 201a, 201b and 201c may be connected to one another so as to surround the first opening 204.

The first metal shield layer 201a may extend in the horizontal direction by a first length L1 as shown in the cross-sectional view of FIG. 7A. In the planar structure, the metal shield layer 201 may have a size corresponding to the first length L1.

The metal shield layer 201 can block the incident light from traveling toward the photoelectric element 110 in the substrate 100. That is, the metal shield layer 201 may block other portions except for the first opening 204, so that only vertical components of the incident light can reach the photoelectric element 110. To sense an object as small as ridges and valleys of a fingerprint, non-vertical ambient light may be blocked in order to more clearly recognize such as ridges and valleys.

The metal shield layer 201 may include a metal. The metal shield layer 201 may include at least one of tungsten (W), aluminum (Al), and copper (Cu), for example.

The color filter structure 202 may be formed on the metal shield layer 201. The color filter structure 202 may cover only a part of the upper surface of the metal shield layer 201 without covering the first opening 204 defined by the metal shield layer 201.

Figure 6E:
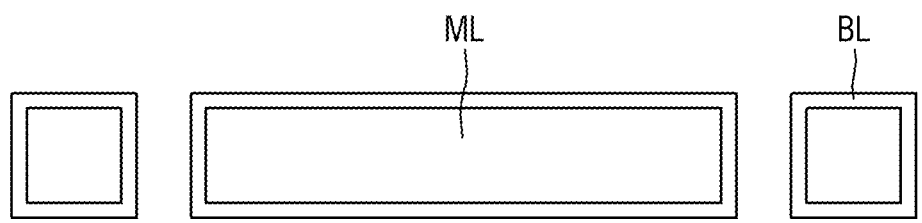
FIG. 6E is an example of a metal shielding layer in the sensor array of FIG. 3.

The metal shield layer 201 may also be multi-layer structure. FIG. 6E illustrates an example where the metal shield layer 201 includes a metal layer ML and a barrier layer BL on the metal layer ML. The barrier layer BL may surround the metal layer ML. The barrier layer BL may include a metal nitride, but is not limited thereto. The metal layer ML may include at least one of tungsten (W), aluminum (Al), and/or copper (Cu), for example.

Referring to FIGS. 7A to 7C, the color filter structure 202 may include a second opening 206, a third opening 208 and a fourth opening 209 that expose the first opening 204. The first to fourth openings 204, 206, 208 and 209 may form the opening O.

The color filter structure 202 may look as if it has a number of features separated from one another by the second opening 206, the third opening 208 and the fourth opening 209 in the cross-sectional view of FIG. 7A. That is, the color filter structure 202 may include the first color filter structure 202a, the second color filter structure 202b, and the third color filter structure 202c.

Although the first to third color filter structures 202a, 202b and 202c look as if they are separated from one another in the cross-sectional view, they may be connected to one another in the plane structure. That is, since the second opening 206, the third opening 208 and the fourth opening 209 may be a circle in the plane structure, the first to third color filter structures 202a, 202b and 202c may be connected to one another so as to surround the second opening 206, the third opening 208 and the fourth opening 209.

The color filter structure 202 may include a first color layer 203, a second color layer 205, and a third color layer 207. The first color layer 203 may be formed on the metal shield layer 201. The first color layer 203 may be smaller than the metal shield layer 201 when viewed from the top. In the cross sectional structure, the first color layer 203 of the first color filter structure 202 may be extended by a second length L2, which is smaller than the first length L1. Accordingly, the first color layer 203 may be smaller than the metal shield layer 201 when viewed from the top.

The second color layer 205 may be formed on the first color layer 203. The second color layer 205 may be smaller than the first color layer 203 when viewed from the top. In the cross sectional structure, the second color layer 205 of the first color filter structure 202 may be extended by a third length L3, which is smaller than the second length L2. Accordingly, the second color layer 205 may be smaller than the first color layer 203 when viewed from the top.

The third color layer 207 may be formed on the second color layer 205. The third color layer 207 may be smaller than the second color layer 205 when viewed from the top. In the cross sectional structure, the third color layer 207 of the first color filter structure 202 may be extended by a fourth length L4, which is smaller than the third length L3. Accordingly, the third color layer 207 may be smaller than the second color layer 205 when viewed from the top.

As shown in FIG. 7A, the side surfaces of the color filter structure 202 may have a stair-like shape having step differences. Likewise, the inner wall of the opening O may also have a stair-like shape. The side surfaces of the color filter structure 202 in FIG. 7B may include curved (or rounded) sidewalls for the first color layer 203, second color layer 205, and third color layer 207. The side surfaces of the color filter structure 202 in FIG. 7C may include tapered (or inclined) sidewalls for the first color layer 203, second color layer 205, and third color layer 207.

Referring to FIGS. 6A to 6C and 7A to 7C, the first color layer 203, the second color layer 205 and the third color layer 207 of the color filter structure 202 may have different colors. For example, the first color layer 203, the second color layer 205 and the third color layer 207 may have red color, blue color and green color, respectively. That is, the color filter structure 202 may have a structure in which color layers having three colors of RGB are stacked on one another.

The color layers may be stacked on one another in a variety of orders. That is, the first color layer 203, the second color layer 205 and the third color layer 207 may be stacked on one another in any order as long as the color layers have red color, blue color, and green color, respectively.

The color filter structure 202 may work to make the image sensor 1220 look dark (e.g., black) from the outside. In some embodiments, the metal shield layer 201 may block incident light coming from the outside and reflect a part of the incident light. Without the color filter structure 202 making the image sensor 1220 look dark, the reflected incident light could exit back to the outside, such that a user could perceive the position of the image sensor. In other words, the user could see the image sensor by her/his eyes as the color of the image sensor changes depending on the reflection angles.

To avoid this, according to some example embodiments of inventive concepts, the color filter structure 202 absorbs a variety of wavelength bands of incident light to thereby make the image sensor 1220 look dark (e.g., black) from the outside and/or a view facing the color filter structure.

In some embodiments, since the first color layer 203, the second color layer 205 and the third color layer 207 have all three colors of red color, blue and green, each having one of them, most wavelength ranges are absorbed thereby and thus the image sensor 1220 can look dark (e.g., black) from the outside. In some example embodiments, an absorbance of the color filter structure 202 may be at least 99 percent in a visible spectrum.

While an example has been discussed where the color filter structure 202 includes three colors of RGB, inventive concepts are not limited thereto. In some example embodiments, the color filter structure 202 may alternatively have three colors of CYM. In other words, the first color layer 203 may have a cyan color, the second color layer 205 may have a yellow color, and the third color layer 207 may have a magenta color, but the stacking order of the first color layer 203, second color layer 205, and third color layer 207 may vary.

The color filter structure 202 may include, but is not limited to, organic components such as photoresist (PR).

The opening O may include first to fourth openings 204, 206, 208 and 209. The first opening 204 may be defined by the metal shield layer 201, and the second opening 206 may be defined by the first color layer 203. The third opening 208 may be defined by the second color layer 205, and the fourth opening 209 may be defined by the third color layer 207.

The first opening 204 may have a first width D1. The second opening 206 may have a second width D2 that is greater than the first width D1. The third opening 208 may have a third width D3 that is greater than the second width D2. The fourth opening 209 may have a fourth width D4 that is greater than the third width D3. That is, the opening O may have a shape that gradually widens toward top in the vertical direction.

The opening O may be aligned with the photoelectric element 110. In some embodiments, the photoelectric element 110 and the opening O may be vertically aligned with a first center line C1 or a second center line C2. By doing so, the vertical components of the incident light can reach the photoelectric element 110 in the substrate 100 through the opening O.

The opening O may be filled with the filling layer 215. The filling layer 215 may include a first filling layer 211, a second filling layer 212, a third filling layer 213 and a fourth filling layer 214. The first opening 204 may be filled with the first filling layer 211, and the second opening 206 may be filled with the second filling layer 212. The third opening 208 may be filled with the third filling layer 213. The fourth opening 209 may be filled with the fourth filling layer 214.

The filling layer 215 may be made of a transparent material so that incident light can transmit it. The filling layer 215 may include at least one of, for example, a material of a silicon oxide layer, a material of a silicon nitride layer, a resin, or a combination thereof.

The upper planarization layer 210 may be formed on the color filter structure 202 and the filling layer 215 to provide a flat surface. The upper planarization layer 210 may include at least one of, for example, a material of a silicon oxide layer, a material of a silicon nitride layer, a resin, or a combination thereof. Although the upper planarization layer 210 is shown as a single layer, this is merely illustrative.

Although FIGS. 6A to 6C and 7A to 7C illustrate that the upper planarization layer 210 and the lower planarization layer 180 are formed on the upper and lower sides of the color filter structure 202, respectively, this is not intended to limit the example embodiments of inventive concepts. For example, only the lower planarization layer may be formed on the lower side of the color filter structure 202 or only the upper planarization layer may be formed on the upper side of the color filter structure 202. Or, no planarization layer may be formed on either side of the color filter structure 202.

A microlens 220 may be formed on the upper planarization layer 210. The microlens 220 may have a convex shape as shown in the drawings. The convex shape of the microlens 220 may concentrate the incident light on each of the first pixel region S1 and the second pixel region S2.

The microlens 220 may be formed of an organic material such as photoresist (PR). It is, however, to be understood that this is merely illustrative. The microlens 220 may also be formed using an inorganic material. To form the microlens 220 using an organic material, an organic material may be patterned on the upper planarization layer 210, and a thermal process may be carried out to form the microlens 220. By carrying out the thermal process, the organic material pattern may be changed into a microlens 220.

The protective layer 230 may be formed to have an even thickness along the surface of the microlens 220. The protective layer 230 may be an inorganic oxide layer. For example, a silicon oxide layer ($SiO_2$), a titanium oxide layer ($TiO_2$), a zirconium oxide layer ($ZrO_2$), a hafnium oxide layer ($HfO_2$) and a stack thereof, or a combination thereof may be used as the protective layer 230. In particular, a low-temperature oxide (LTO), which is a kind of silicon oxide layer, may be used for the protective layer 230. The LTO is used because the LTO is produced at a low temperature (approximately 100° C. to 200° C.), such that it is possible to avoid layers disposed thereunder from being damaged. In addition, since LTO is amorphous, the surface is smooth, such that it is possible to reduce reflection/refraction/scattering of incident light.

Since the microlens 220 is made of an organic material, it may be vulnerable to an external impact. Accordingly, the protective layer 230 may protect the microlens 220 from an external impact. In addition, there may be some space between adjacent microlenses, and the protective layer 230 serves to fill the space.

By filling the space between the adjacent microlenses, it is possible to increase the concentrating efficiency of the incident light. By doing so, the reflection/refraction/scattering of the incident light reaching the space between the adjacent microlens 220 can be reduced.

Referring to FIGS. 6A to 6D, the insulating structure 300 may be formed on the first surface 100a of the substrate 100. That is, the insulating structure 300 may be formed on the front side of the substrate 100. The insulating structure 300 may include an insulating layer 320, a gate structure 310, and a wiring structure 330.

The insulating layer 330 may include at least one of, for example, a silicon oxide layer, a silicon nitride layer, a silicon oxynitride layer, a low-k material, and a combination thereof. The insulating layer 330 may cover and surround the gate structure 310 and the wiring structure 330 to be described later. That is, the insulating layer 330 may provide insulation between the gate structure 310 and the wiring structure 330.

The gate structure 310 may be disposed on the first surface 100a of the substrate 100. The gate structure 310 may be, for example, the gate of the charge transfer transistor 15, the gate of the reset transistor 18, the gate of the selection transistor 19, the gate of the drive transistor 17 shown in FIG. 2, or the like.

Although FIGS. 6A to 6D show that the gate structure 310 is formed on the first surface 100a of the substrate 100, this is merely illustrative. It is to be understood that the gate structure 310 may be recessed or embedded into the substrate 100.

The wiring structure 330 may include at least one of aluminum (Al), copper (Cu), tungsten (W), cobalt (Co), or ruthenium (Ru), and/or the like, but is not limited thereto.

The wiring structure 330 may include a number of wirings formed in each of the first pixel region S1 and the second pixel region S2 and sequentially stacked on one another. In FIGS. 6A to 6D, the wiring structure 330 includes three layers sequentially stacked on one another for convenience of illustration. However, this is merely illustrative.

As the wiring structure 330 is located on the first surface 100a of the substrate 100, the area through which the incident light is transmitted to the second surface 100b can become larger. In addition, as the wiring structure 330 is disposed on the first surface 100a of the substrate 100, the incident light can be reflected off the wiring structure 330 and then directed back to the first photoelectric element 110, thereby increasing the efficiency of the image sensor.

Referring to FIG. 8, the color filter structure 202 may guide incident light. In some embodiments, the incident light may include the components concentrated into the opening O by the microlens 220, as well as the components not concentrated. The sensing efficiency of the image sensor 1220 can be increased when the components of the incident light concentrated into the opening O reach the photoelectric element 110 as much as possible.

For this reason, the color filter structure 202 may have the stair-like shape so that it does not block the components of incident light concentrated into the opening O. That is, the shape of the color filter structure 202 may be designed such that the guide path LG of the incident light is not blocked by the color filter structure 202.

On the other hand, the components of incident light not directed to the opening O may be absorbed by the color filter structure 202. That is, the color filter structure 202 absorbs incident light not directed into the opening O as much as possible, thereby reducing the amount of reflected light while making the image sensor 1220 look dark (e.g., black) from the outside.

Hereinafter, referring to FIGS. 9A, 9B, and 9C, image sensors according to some example embodiments of inventive concepts will be described. Descriptions of the identical elements described above will be omitted or briefly described to avoid redundancy.

Figure 9A:
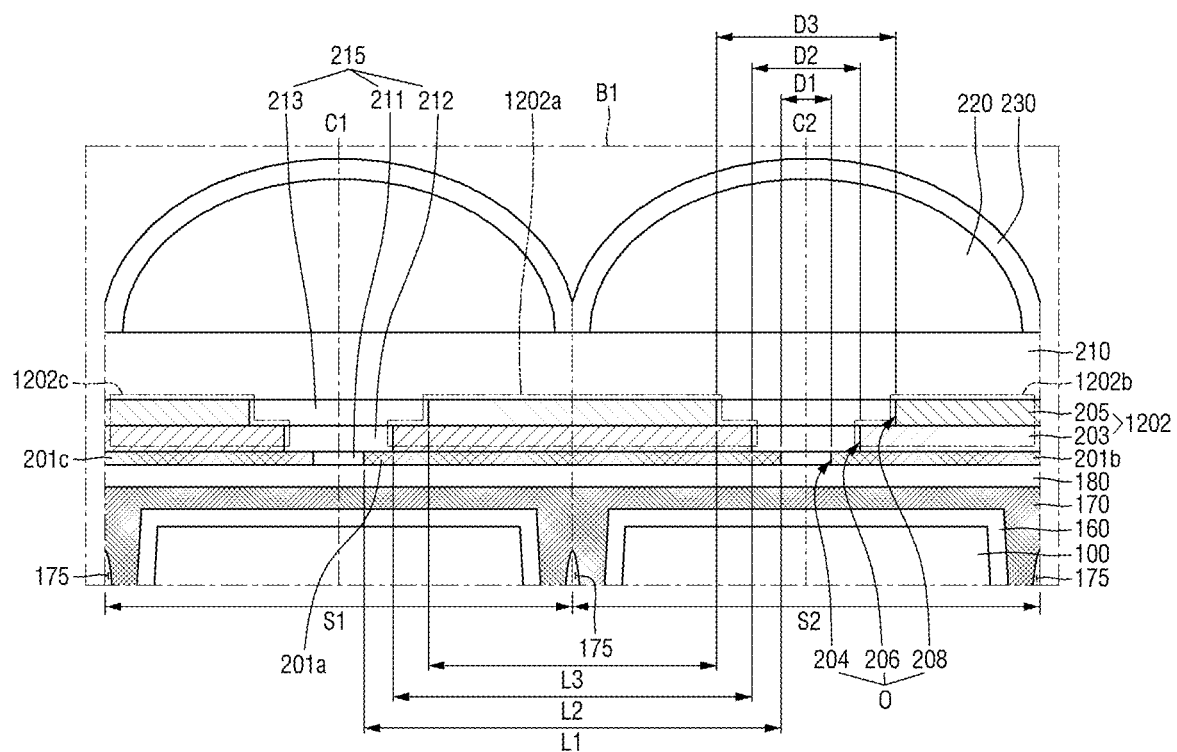
FIGS. 9A, 9B, and 9C are enlarged, cross-sectional views for illustrating parts of image sensors according to some example embodiments of inventive concepts.
Figure 9B:
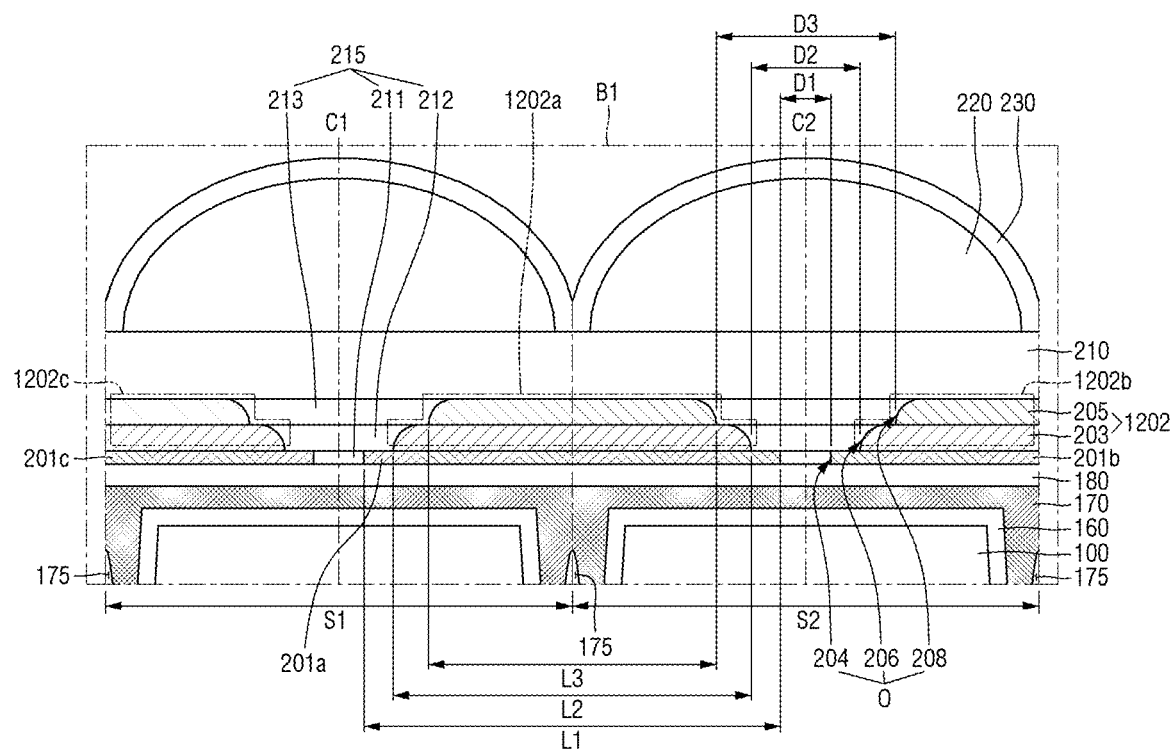
Figure 9C:
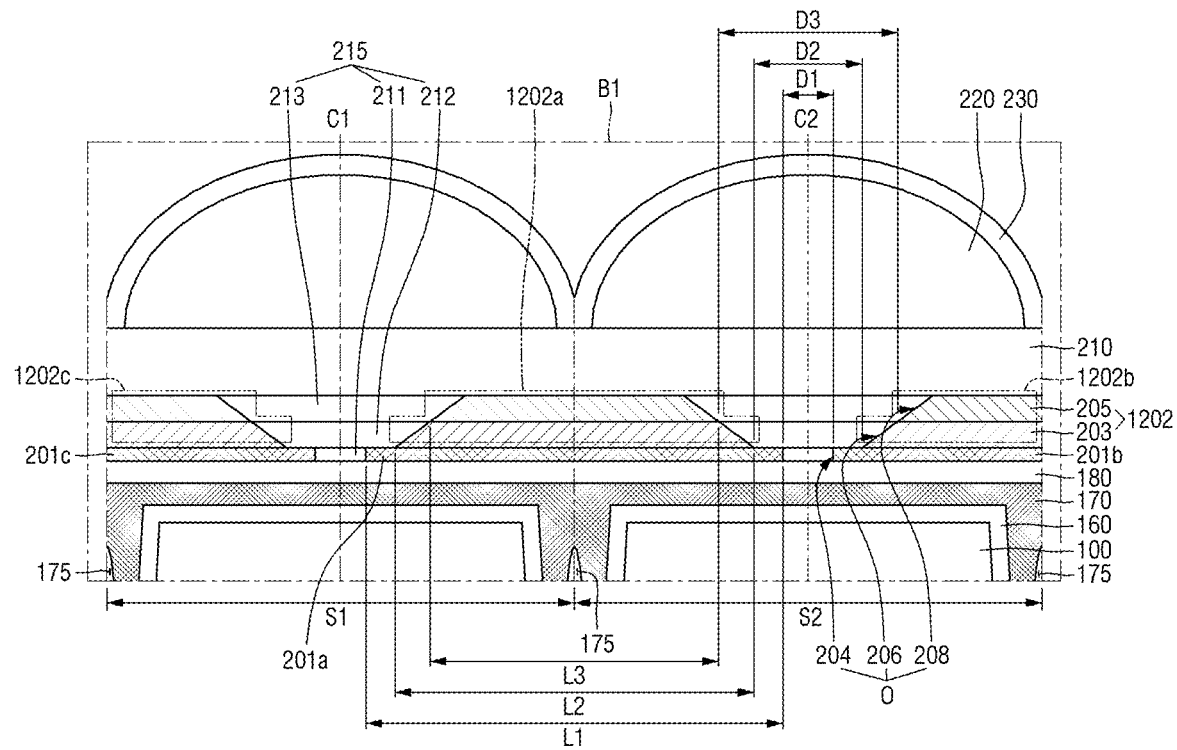

FIGS. 9A, 9B, and 9C are enlarged, cross-sectional views for illustrating parts of image sensors according to some example embodiments of inventive concepts.

Referring to FIGS. 9A, 9B, and 9C, a color filter structure 1202 of the image sensor 1220 according to some example embodiments of inventive concepts may include a stack structure of two layers, e.g., a first color layer 203 and a second color layer 205. The first color layer 203 and the second color layer 205 may have vertical (e.g., straight) sidewalls (see FIG. 9A), curved sidewalls (see FIG. 9B), or tapered sidewalls (see FIG. 9C).

The first color layer 203 may be formed on a metal shield layer 201. The first color layer 203 may be smaller than the metal shield layer 201 when viewed from the top. In the cross sectional structure, the first color layer 203 of the first color filter structure 1202 may be extended by a second length L2, which is smaller than the first length L1. Accordingly, the first color layer 203 may be smaller than the metal shield layer 201 when viewed from the top.

The second color layer 205 may be formed on the first color layer 203. The second color layer 205 may be smaller than the first color layer 203 when viewed from the top. In the cross sectional structure, the second color layer 205 of the first color filter structure 1202 may be extended by a third length L3, which is smaller than the second length L2. Accordingly, the second color layer 205 may be smaller than the first color layer 203 when viewed from the top.

The first color layer 203 and the second color layer 205 of the color filter structure 1202 may have different colors. For example, the first color layer 203 and the second color layer 205 may have red color and blue color. That is, the color filter structure 1202 may have a structure in which color layers having two colors of RB are stacked on each other.

The color layers may be stacked on each other in a variety of orders. That is, the first color layer 203 and the second color layer 205 may be stacked on each other in any order as long as the color layers have red color and blue color, respectively.

Since the red color and the blue color filter the wavelength bands located farthest from each other in the visible range, it is possible to make the image sensor 1220 look dark (e.g., black) from the outside with only two color layers.

Therefore, according to some example embodiments, it is possible to make the image sensor 1220 look dark (e.g., black) from the outside with only two color layers quickly and cheaper.

Hereinafter, image sensors according to some example embodiments of inventive concepts will be described with reference to FIGS. 10A, 10B, and 10C. Descriptions of the identical elements described above will be omitted or briefly described to avoid redundancy.

Figure 10A:
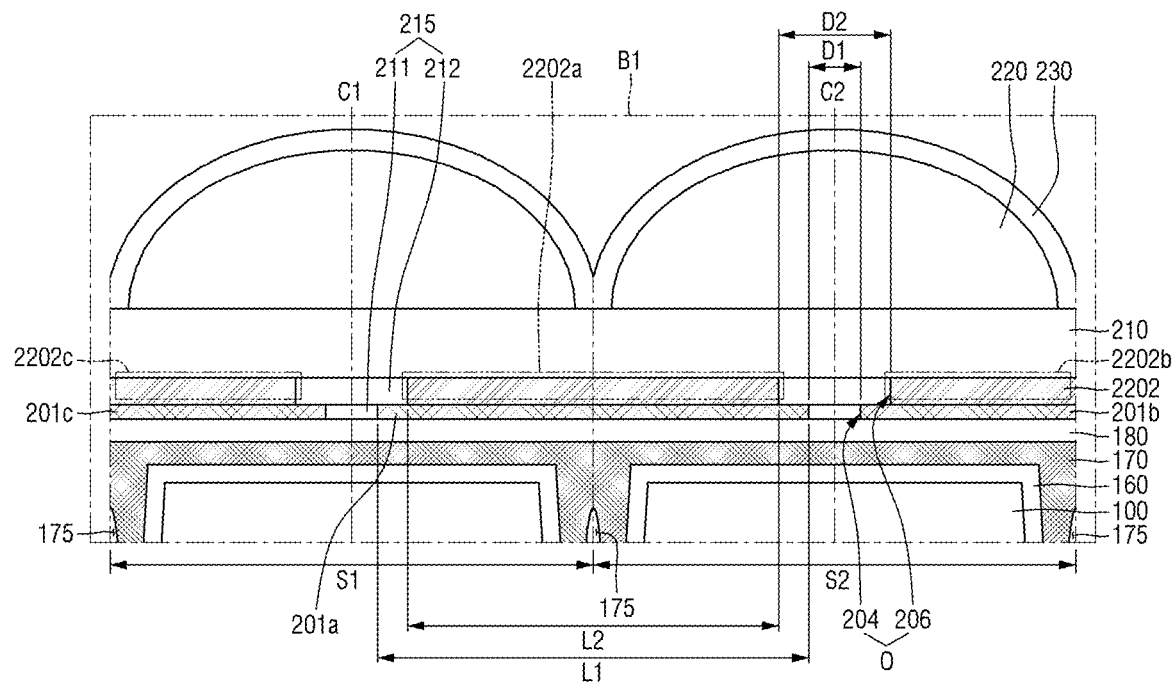
FIGS. 10A, 10B, and 10C are enlarged, cross-sectional views for illustrating parts of image sensors according to some example embodiments of inventive concepts.
Figure 10B:
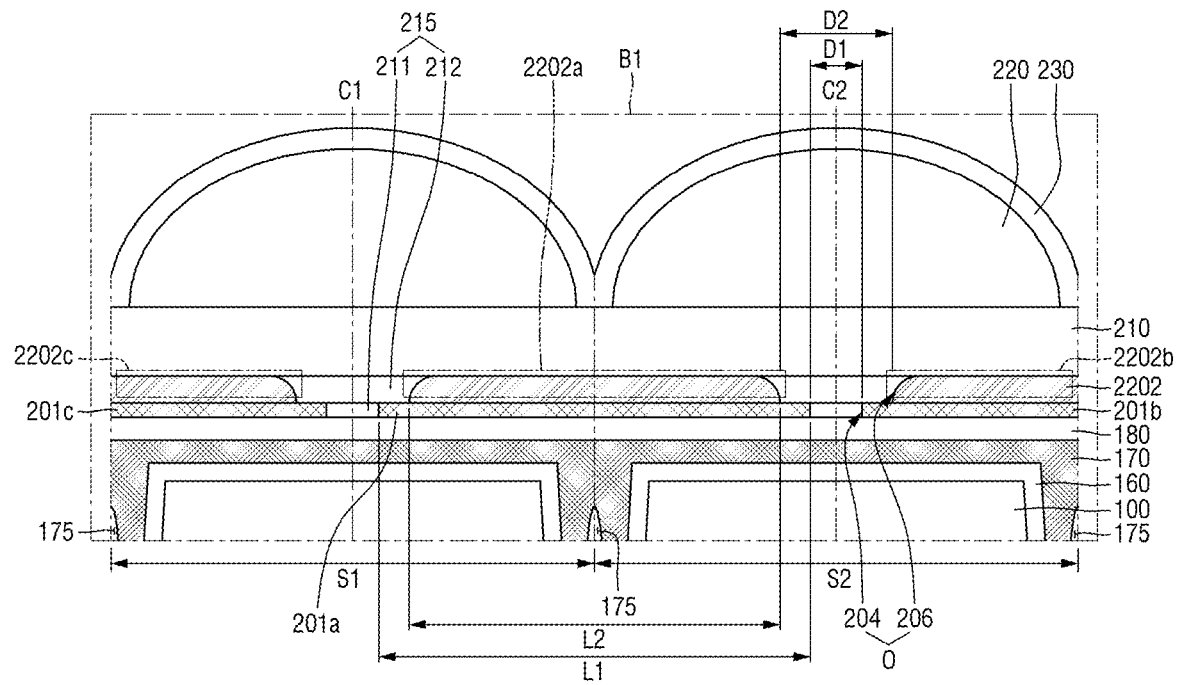
Figure 10C:
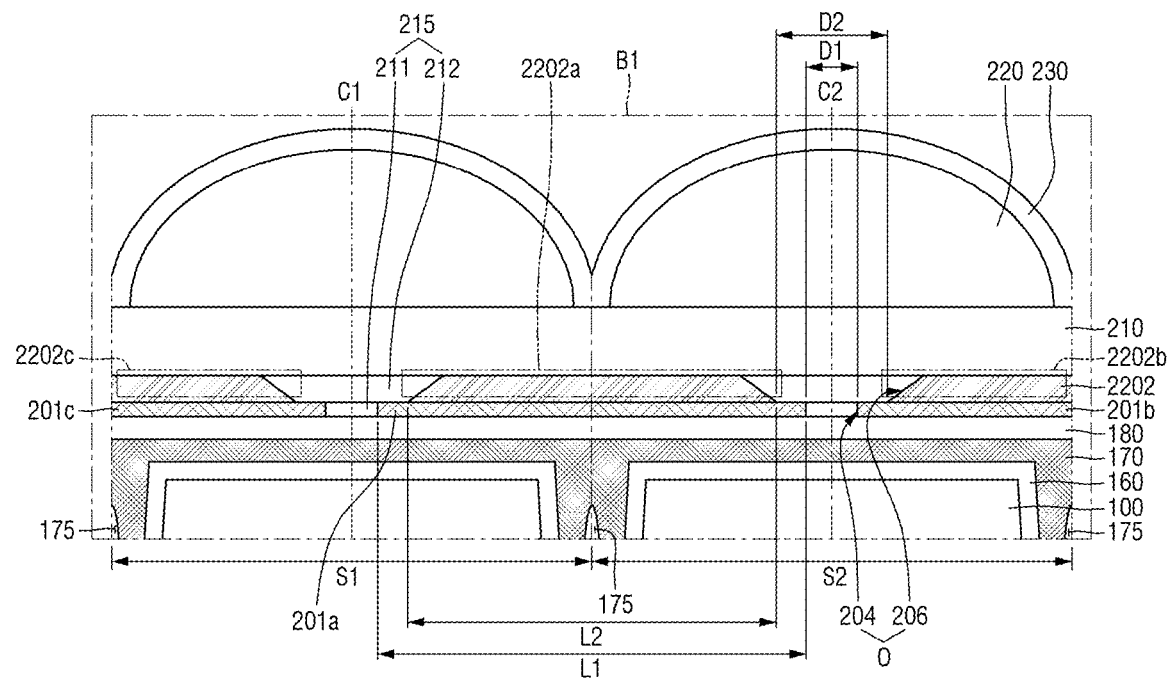

FIGS. 10A, 10B, and 10C are enlarged, cross-sectional views for illustrating parts of image sensors according to some example embodiments of inventive concepts.

Referring to FIGS. 10A, 10B, and 10C, the color filter structure 2202 of the image sensor 1220 according to some example embodiments of inventive concepts may include a structure of a signal color layer. The color filter structure 2202 may have vertical (e.g., straight) sidewalls (see FIG. 10A), curved sidewalls (see FIG. 10B), or tapered sidewalls (see FIG. 10C).

The color filter structure 2202 may be formed on the metal shield layer 201. The color filter structure 2202 may be smaller than the metal shield layer 201 when viewed from the top. In the cross sectional structure, the first color filter structure 2202 may be extended by a second length L2, which is smaller than the first length L1. Accordingly, the first filter structure 2202 may be smaller than the metal shield layer 201 when viewed from the top.

The color filter structure 2202 may have black color. Since the black color absorbs all wavelengths of the visible spectrum, it is possible to achieve the black appearance of the image sensor 1220 with only one color layer. In some example embodiments, an absorbance of the color filter structure 2202 may be at least 99 percent in a visible spectrum.

Because the color filter structure 2202 may have black color, it is possible to make the image sensor 1220 look black from the outside with only one color layer quickly and cheaper. The color filter structure 2202 may cover at least 70 percent of an area of a single pixel region (e.g., S1, S2) in which the photoelectric element 110 is disposed.

Hereinafter, image sensors according to some example embodiments of inventive concepts will be described with reference to FIGS. 11A, 11B, and 11C. Descriptions of the identical elements described above will be omitted or briefly described to avoid redundancy.

Figure 11A:
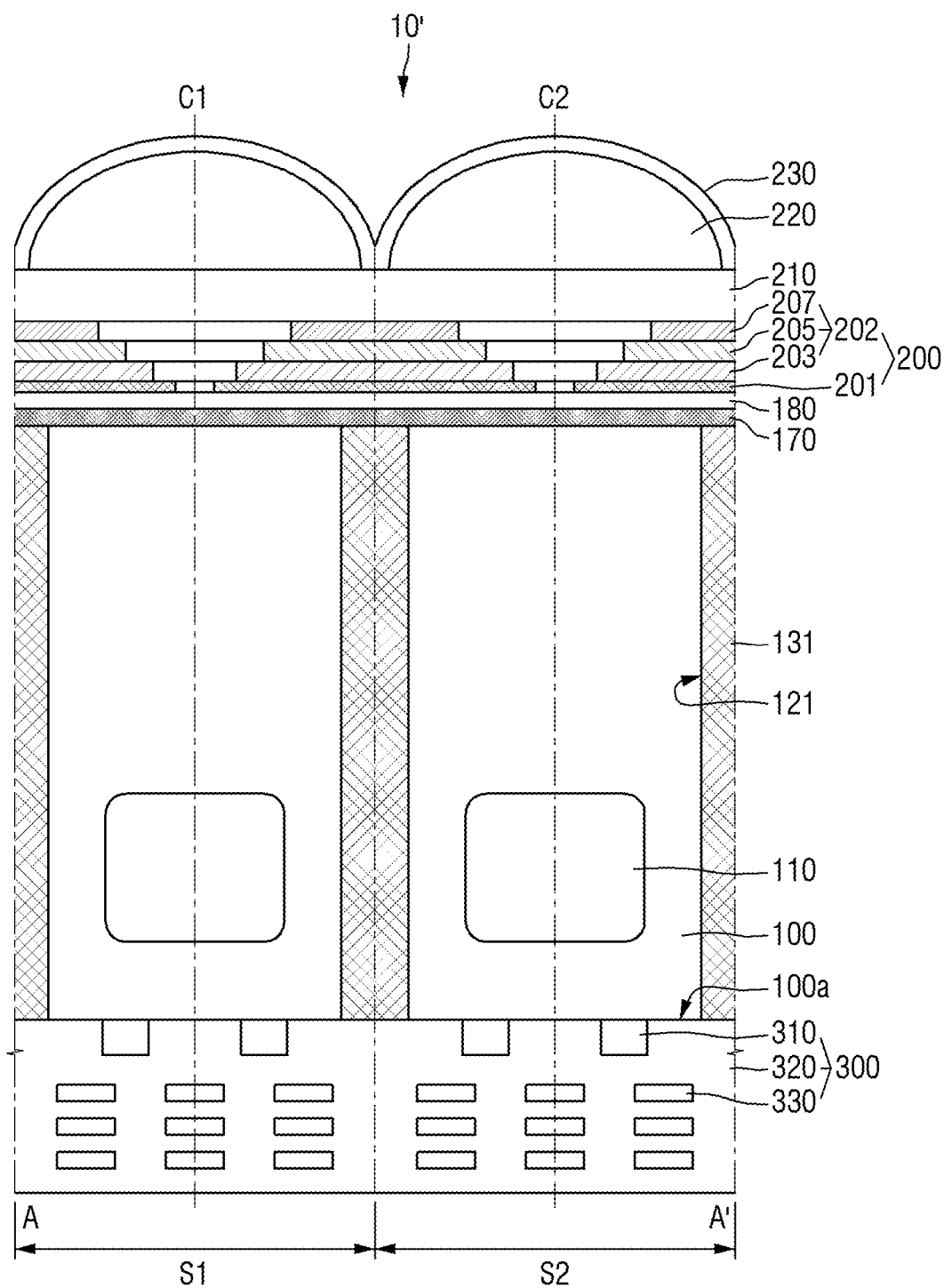
FIGS. 11A, 11B, and 11C are cross-sectional views for illustrating parts of image sensors according to some example embodiments of inventive concepts.
Figure 11B:
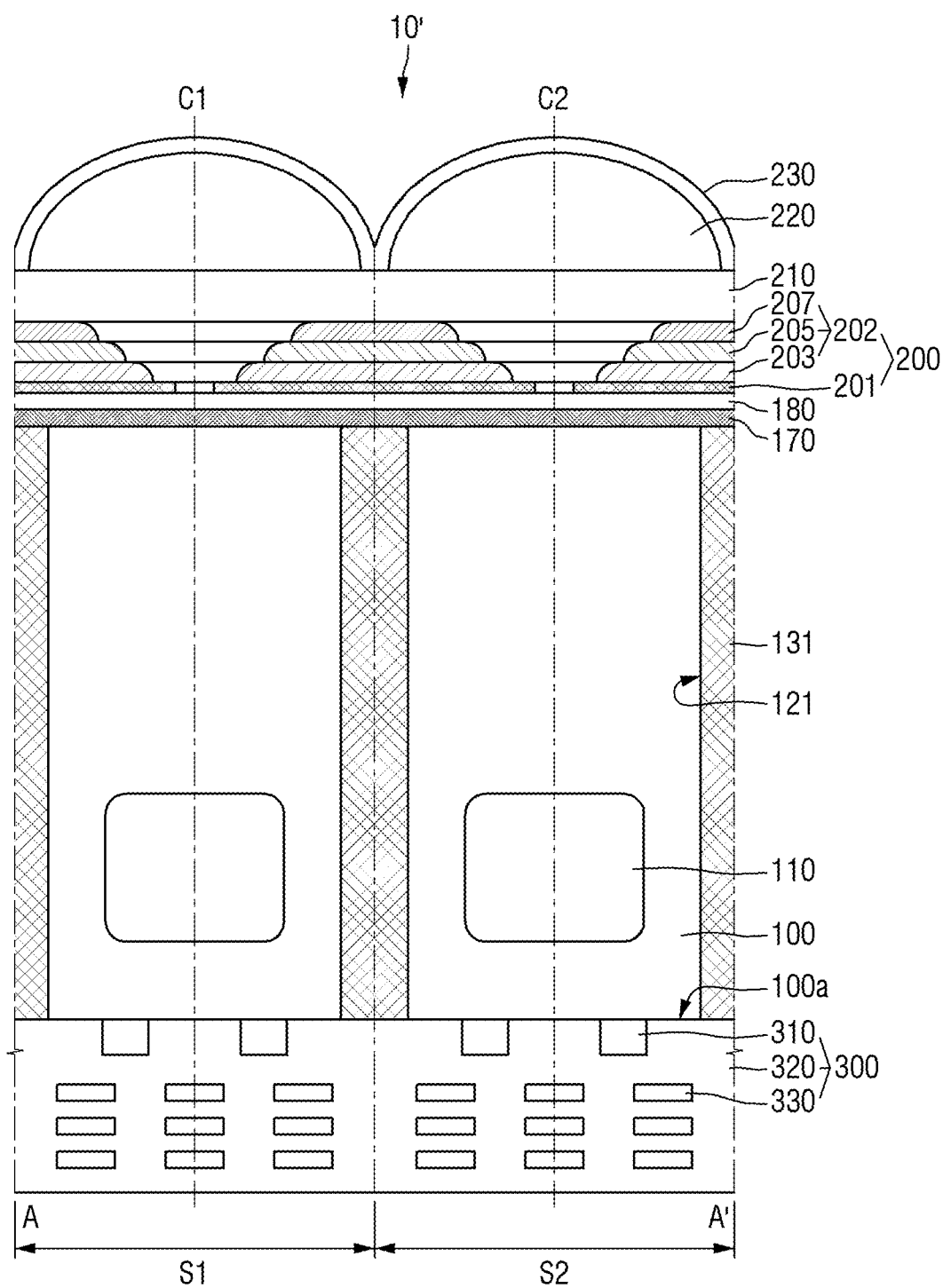
Figure 11C:
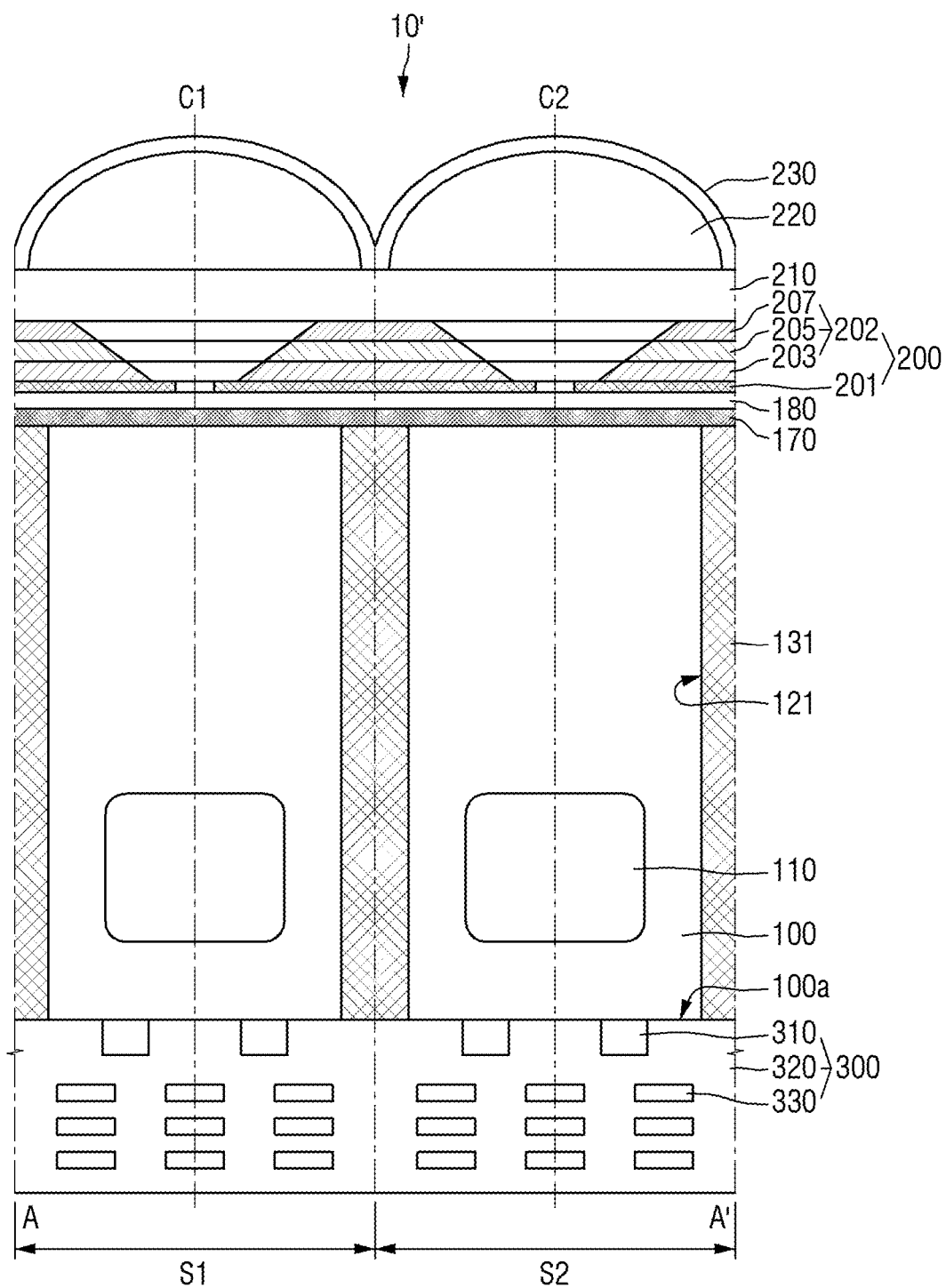

FIGS. 11A, 11B, and 11C are cross-sectional views for illustrating parts of image sensors according to some example embodiments of inventive concepts.

In FIG. 11A, in a sensor array 10' of an image sensor according to some example embodiments, the side surfaces of the color filter structure 202 may have vertical (e.g., straight) sidewalls. Alternatively, as shown in FIG. 11B, the side surfaces of the color filter structure 202 may include curved (or rounded) sidewalls for the first color layer 203, second color layer 205, and third color layer 207. Alternatively, as shown in FIG. 11C, The side surfaces of the color filter structure 202 may include tapered (or inclined) sidewalls for the first color layer 203, second color layer 205, and third color layer 207.

Similar to the sensor arrays discussed in FIGS. 9A to 9C, the third color layer 207 may be omitted from the color filter structures 202 shown in FIGS. 11A to 11C. Alternatively, the color filter structures 202 shown in FIGS. 11A to 11C may be substituted with the black color filter structure 2202 from FIGS. 10A to 10C.

Referring to FIGS. 11A, 11B, and 11C, sensor arrays 10' of an image sensor 1220 according to some example embodiments of inventive concepts includes an isolation trench 121 and an isolation layer 131.

The isolation trench 121 may connect the first surface 100a with the second surface 100b of the substrate 100. That is, the isolation trench 121 may penetrate through a thickness of the substrate 100. The isolation trench 120 can completely surround the boundary between the first pixel region S1 and the second pixel region S2 in the horizontal cross section as well as in the vertical cross section.

The isolation trench 121 may be formed by a front side deep trench isolation (FDTI) process. The isolation layer 131 may be used to completely fill the isolation trench 121. Accordingly, the isolation layer 131 may be exposed from the first surface 100a and the second surface 100b of the substrate 100. That is, the isolation layer 131 may have the first surface in the same plane as the first surface 100a of the substrate 100 and the second surface in the same plane as the second surface 100b of the substrate 100. The isolation layer 131 may surround the photoelectric element 110.

Although the isolation trench 121 and the isolation layer 131 have an even width in the drawing, this is merely illustrative. The isolation trench 121 and the isolation layer 131 may be formed in a tapered shape. That is, the width of the isolation trench 121 may be reduced toward the first surface 100a from the second surface 100b.

In some example embodiments, the isolation layer 131 may include a conductive material such as polysilicon and metal. In such case, the isolation layer 131 can fix charges at the interface with the substrate 100 via a process of applying a negative voltage. Alternatively, the charge fixing region may be formed at the interface via a doping process. Alternatively, in some embodiments, the isolation layer 131 may include a dielectric material (e.g., silicon oxide).

Hereinafter, a method for fabricating a sensor array of image sensor according to some example embodiments of inventive concepts will be described with reference to FIGS. 12 to 23. Descriptions of the identical elements described above will be omitted or briefly described to avoid redundancy.

Figure 15:
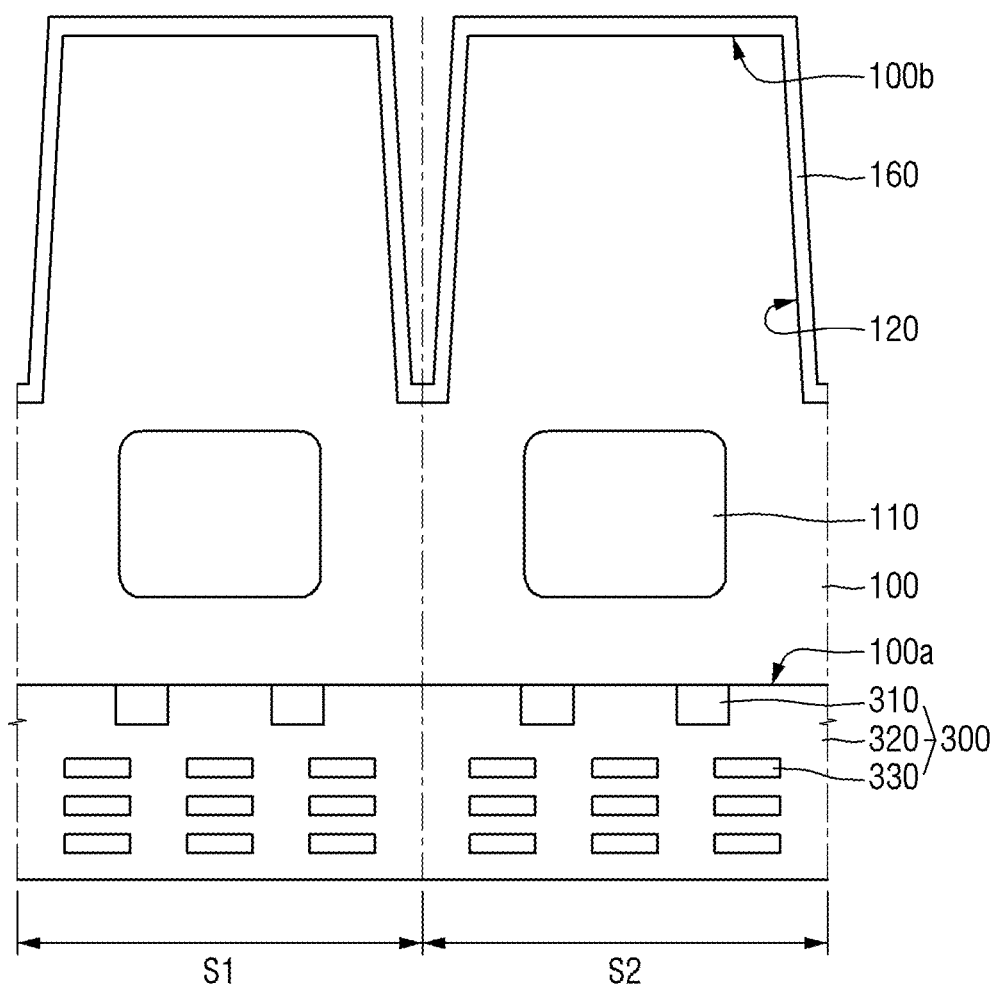
Figure 16:
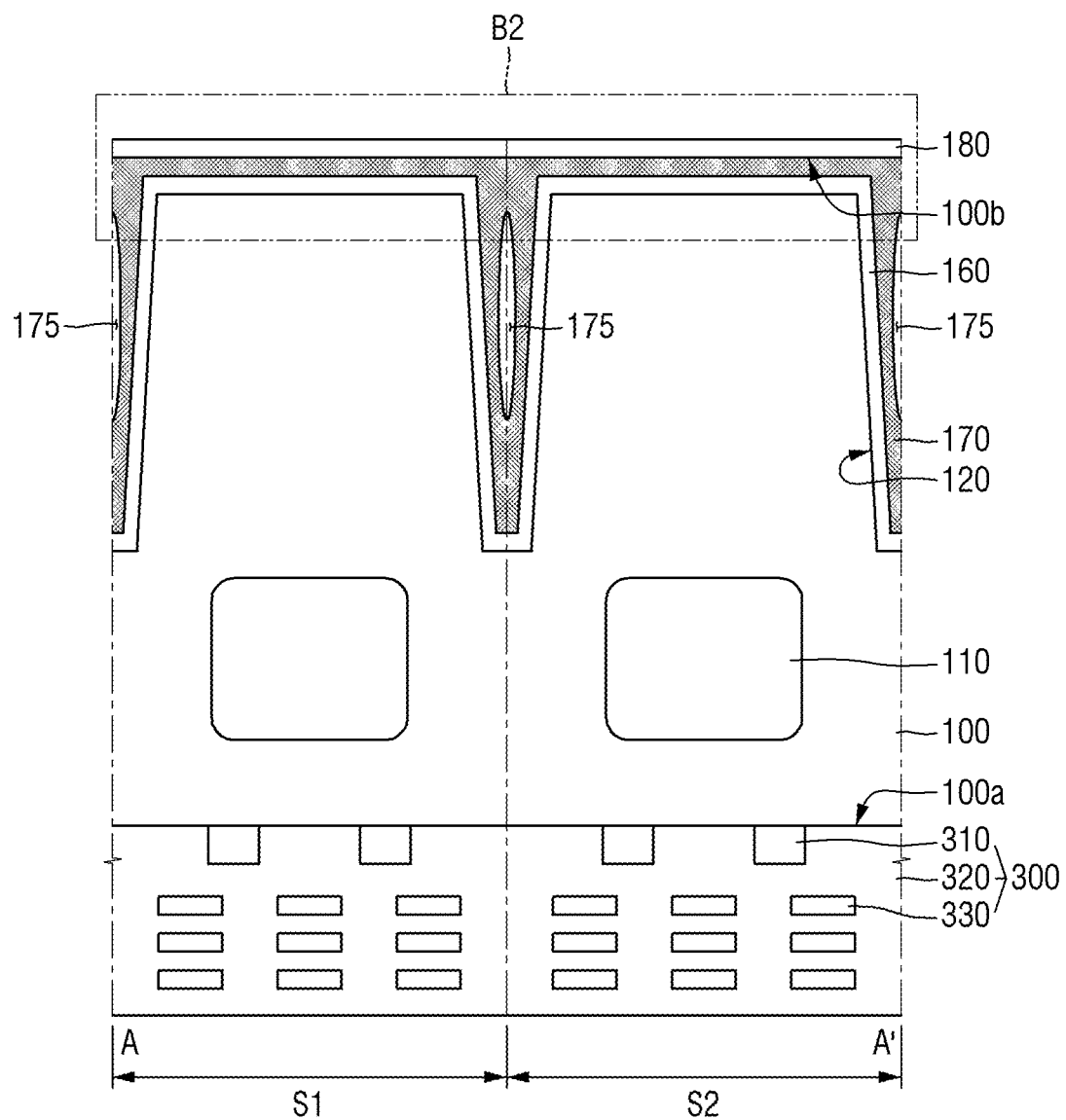
Figure 17:
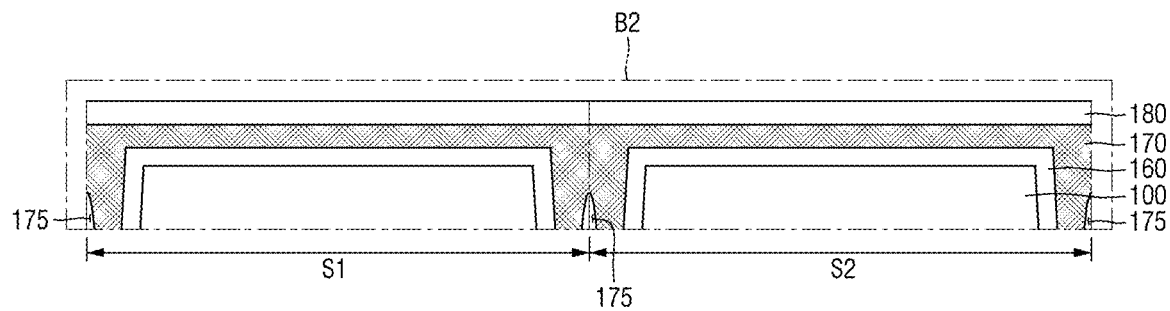

FIGS. 12 to 23 are cross-sectional views for illustrating processing operations of a method for fabricating an image sensor according to some example embodiments of inventive concepts. FIG. 17 is an enlarged view of portion B2 of FIG. 16.

Figure 12:
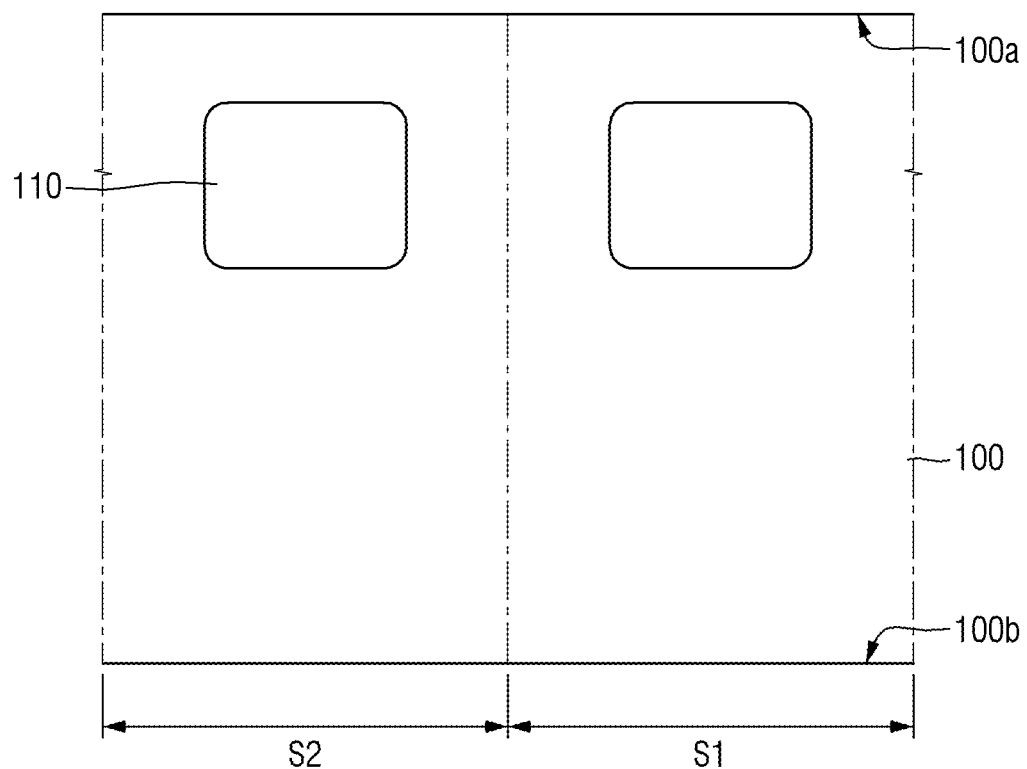
FIGS. 12 to 23 are cross-sectional views for illustrating processing operations of a method for fabricating an image sensor according to some example embodiments of inventive concepts.

Referring to FIG. 12, a substrate 100 is prepared.

The substrate 100 may include a first surface 100a and a second surface 100b opposed to the first surface 100a. The first surface 100a may be the front side of the substrate 100, and the second surface 100b may be the back side of the substrate 100. The substrate 100 may have a photoelectric element 110 therein. The photoelectric element 110 may be disposed in each of the first pixel region S1 and the second pixel region S2 of the substrate 100.

Figure 13:
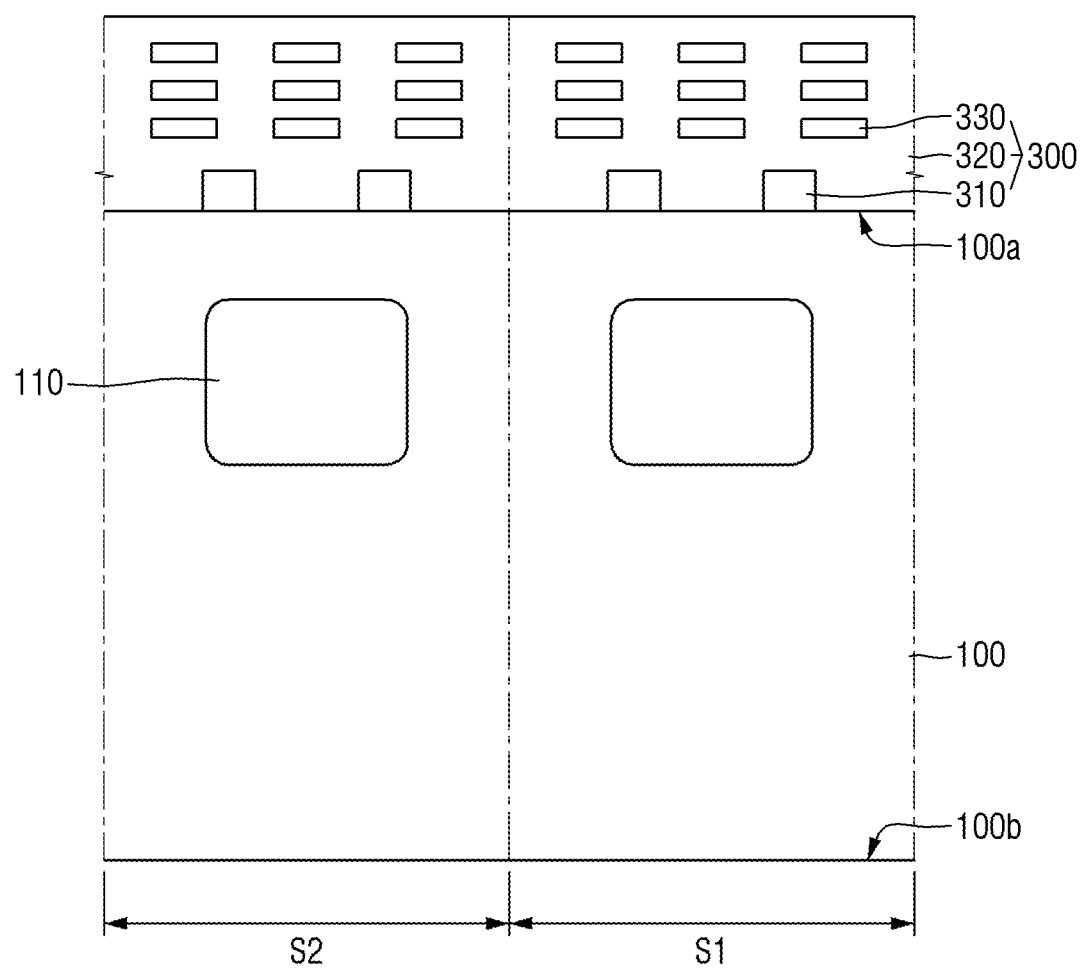

Subsequently, referring to FIG. 13, an insulating structure 300 is formed on the first surface 100a.

The insulating structure 300 may be formed on the first surface 100a of the substrate 100. That is, the insulating structure 300 may be formed on the front side of the substrate 100. The insulating structure 300 may include an insulating layer 320, a gate structure 310, and a wiring structure 330.

Figure 14:
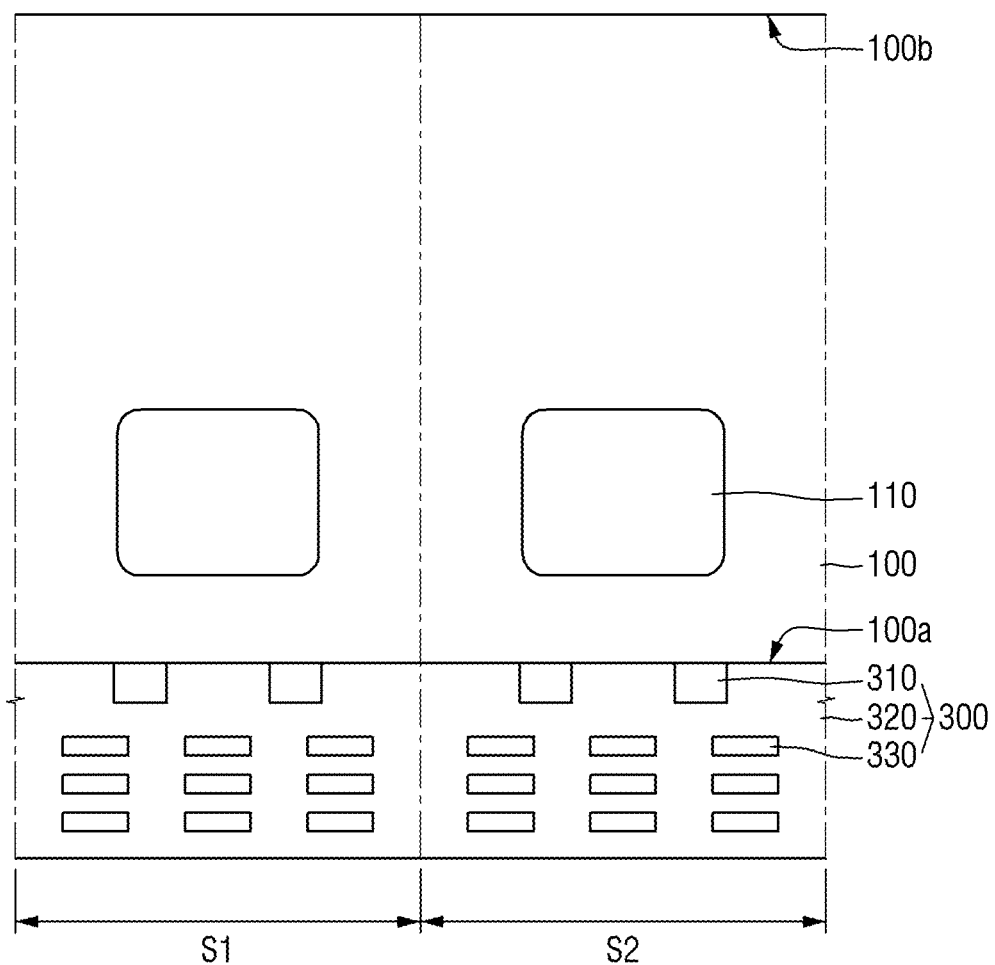

Subsequently, referring to FIG. 14, the substrate 100 is turned over so that the second surface 100b is at the top.

As a result, the first surface 100a of the substrate 100 is now the lower surface while the second surface 100b is now the upper surface. Accordingly, the insulating structure 300 may be disposed under the substrate 100.

Subsequently, referring to FIG. 15, an isolation trench 120 and a fixed charge film 160 are formed.

The fixed charge film 160 may be formed on the second surface 100b of the substrate 100 and along the side and bottom surfaces of the isolation trench 120. Only a part of the isolation trench 120 may be filled with the fixed charge film 160.

Subsequently, referring to FIGS. 16 and 17, an anti-reflection film 170 is formed.

The anti-reflection film 170 may be formed on the fixed charge film 160. The anti-reflection film 170 may be disposed on the fixed charge film 160. The isolation trench 120 may be filled with the anti-reflection film 170. The anti-reflection film 170 serves to limit and/or prevent reflection of incident light from the outside. A void 175 may be formed in the anti-reflection film 170 depending on the gap fill capability of the anti-reflection film 170.

Subsequently, a lower planarization layer 180 is formed.

The lower planarization layer 180 may be formed on the anti-reflection film 170. The lower planarization layer 180 may include at least one of, for example, a material of a silicon oxide layer, a material of a silicon nitride layer, a resin, or a combination thereof.

Figure 18:
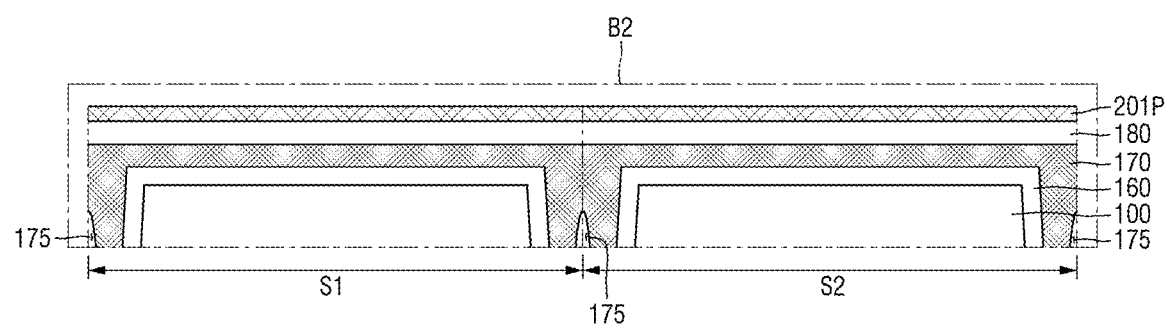

Subsequently, referring to FIG. 18, a preliminary metal shield layer 201P is formed.

The preliminary metal shield layer 201P may be formed on the lower planarization layer 180. The preliminary metal shield layer 201P may include at least one of tungsten (W), aluminum (Al), and copper (Cu), for example.

Figure 19:
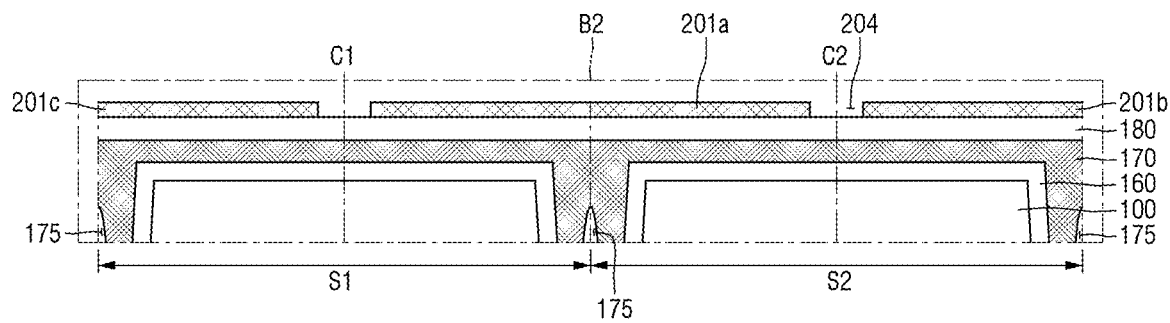

Subsequently, referring to FIG. 19, the preliminary metal shield layer 201P is patterned, so that a metal shield layer 201 and a first opening 204 are formed.

The first opening 204 may be aligned with the first center line C1 or the second center line C2. The metal shield layer 201 may cover the upper surface of the lower planarization layer 180 except the portion exposed via the first opening 204.

Figure 20:
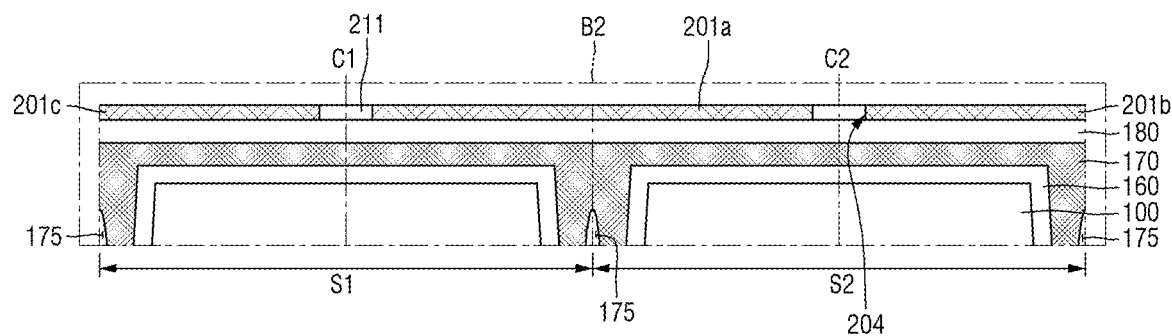

Subsequently, referring to FIG. 20, a first filling layer 211 is formed, to fill the first opening 204.

Like the first opening 204, the first filling layer 211 may be aligned with the first center line C1 or the second center line C2.

Figure 21:
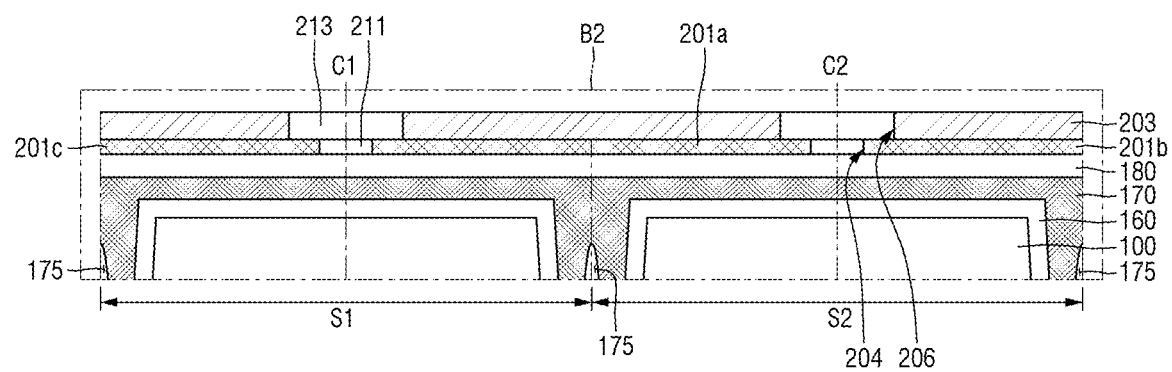

Subsequently, referring to FIG. 21, a first color layer 203, a second opening 206 and a second filling layer 212 are formed.

Initially, the first color layer 203 is formed. Then, it is exposed to light to be cured and patterned, to form the second opening 206. Subsequently, the second filling layer is formed, to fill the second opening 206.

Figure 22:
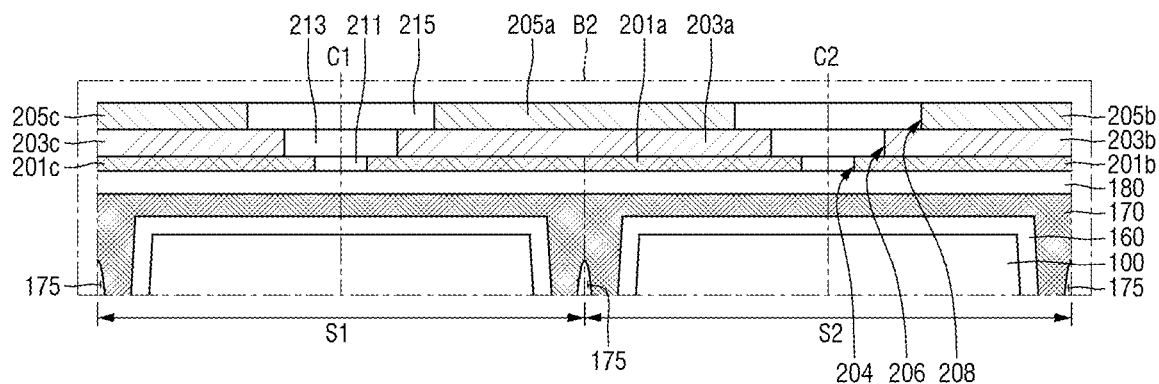

Subsequently, referring to FIG. 22, a second color layer 205, a third opening 208, and a third filling layer 213 are formed.

Initially, the second color layer 205 is formed. Then, it is exposed to light to be cured and patterned, to form the third opening 208. Subsequently, the third filling layer is formed, to fill the third opening 208.

Figure 23:
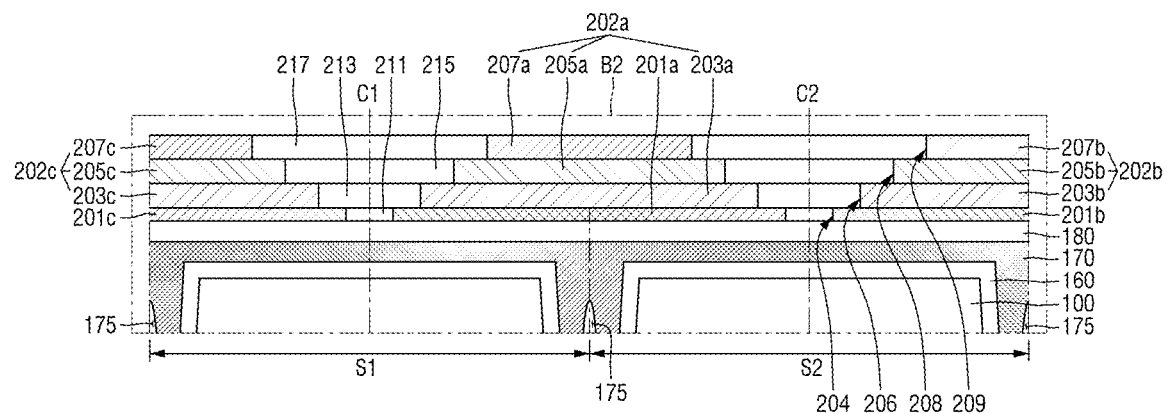

Subsequently, referring to FIG. 23, a third color layer 207, a fourth opening 209 and a fourth filling layer 214 are formed.

Initially, the third color layer 207 is formed. Then, it is exposed to light to be cured and patterned, to form the fourth opening 209. Subsequently, the fourth filling layer is formed, to fill the fourth opening 209.

Subsequently, referring to FIG. 7A, an upper planarization layer 210, a microlens 220, and a protective layer 230 are formed.

The filling layer 215 may be formed whenever each of the metal shield layer 201, the first color layer 203, the second color layer 205 and the third color layer 207 is formed. According to some example embodiments of inventive concepts, however, the color filter structure 202 may be formed first, and then the opening O and the filling layer 215 may be formed together at once.

The method described above in FIGS. 12 to 23 may be modified in various ways. For example, referring to FIGS. 14-15, the isolation layer 130a described in FIG. 6D may be formed in the isolation trench 120 and planarized before forming the fixed charge film 160 on the isolation layer 130a. Thereafter, the anti-reflection film 170, the lower planarization layer 180, metal shield layer 201, color filter structure 202, upper planarization layer 210, and microlens 220 may be formed on the fixed charge film 160.

FIGS. 24 to 29 are cross-sectional views for illustrating processing operations of a method for fabricating an image sensor according to some example embodiments of inventive concepts.

Figure 24:
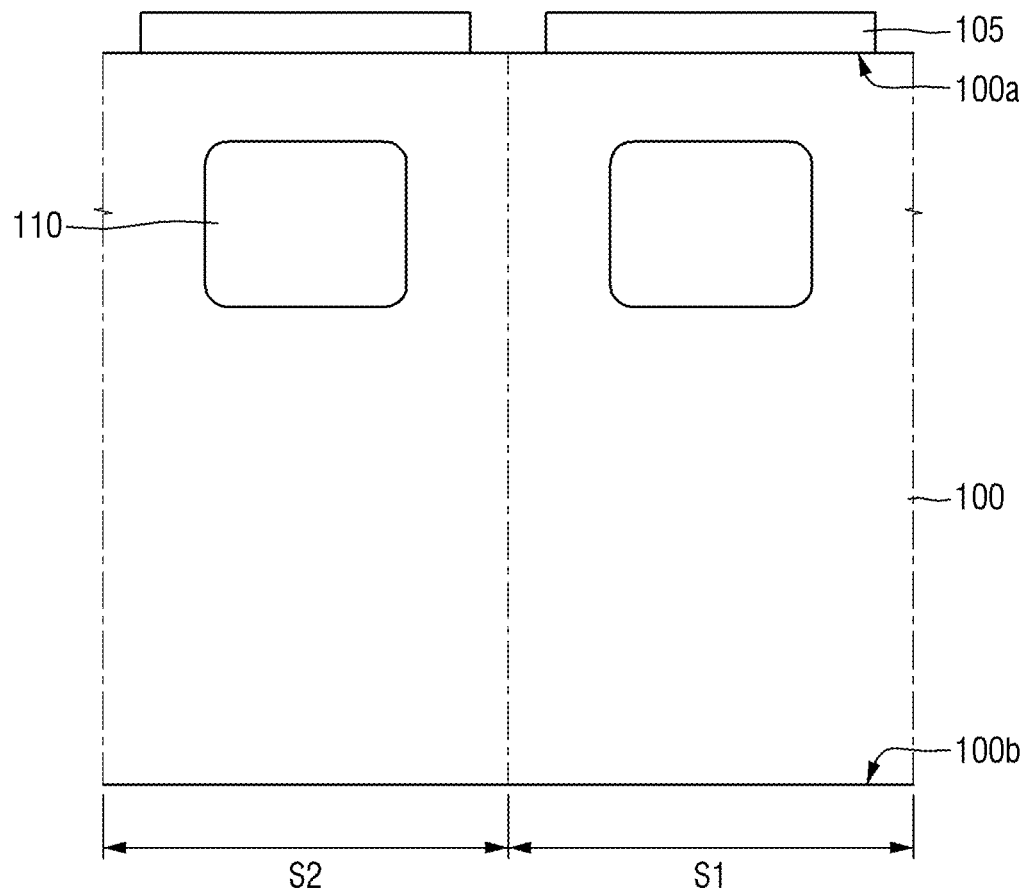
FIGS. 24 to 29 are cross-sectional views for illustrating processing operations of a method for fabricating an image sensor according to some example embodiments of inventive concepts.

Referring to FIG. 24, photoelectric elements 110 may be formed in a substrate 100 including a first surface 100a. A resist pattern 105 may be formed on the first surface 100a of the substrate 100.

Figure 25:
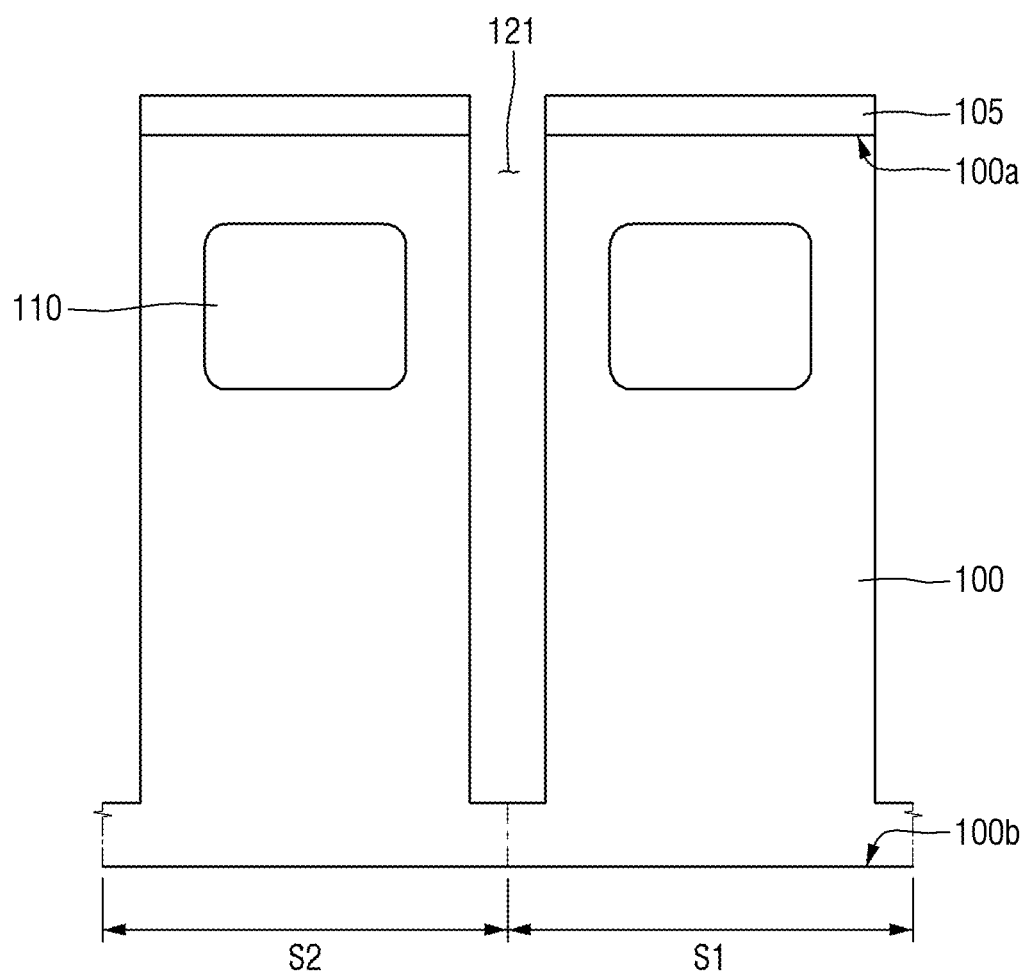

Referring to FIG. 25, isolation trenches 121 may be formed in the substrate 100. A depth of the isolation trench 121 may be less than a thickness of the substrate 100.

Figure 26:
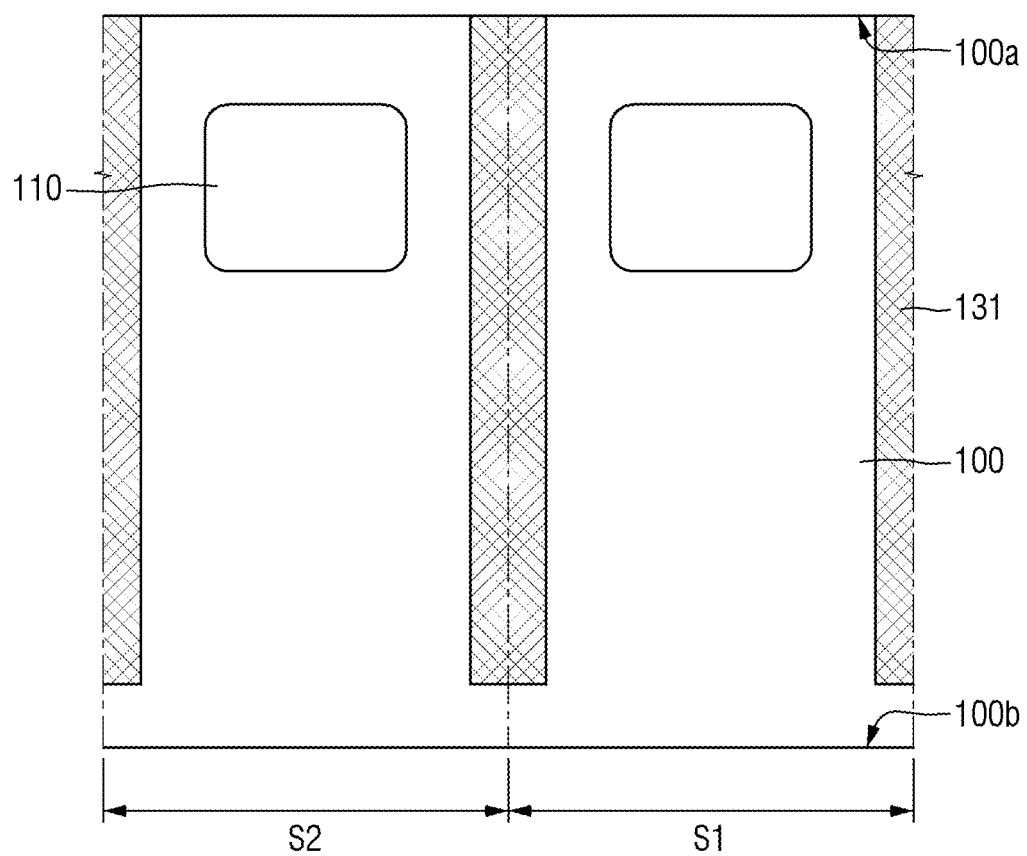

Referring to FIG. 26, an isolation film may be formed in the isolation trenches 121 and planarized to form the isolation layer 131. In some example embodiments, the isolation layer 131 may include a conductive material such as polysilicon and metal or a dielectric material such as silicon oxide. Although not illustrated, a doping process may be performed to dope sidewalls of the isolation trench 121. In such case, the isolation layer 131 can fix charges at the interface with the substrate 100 via a process of applying a negative voltage.

Figure 27:
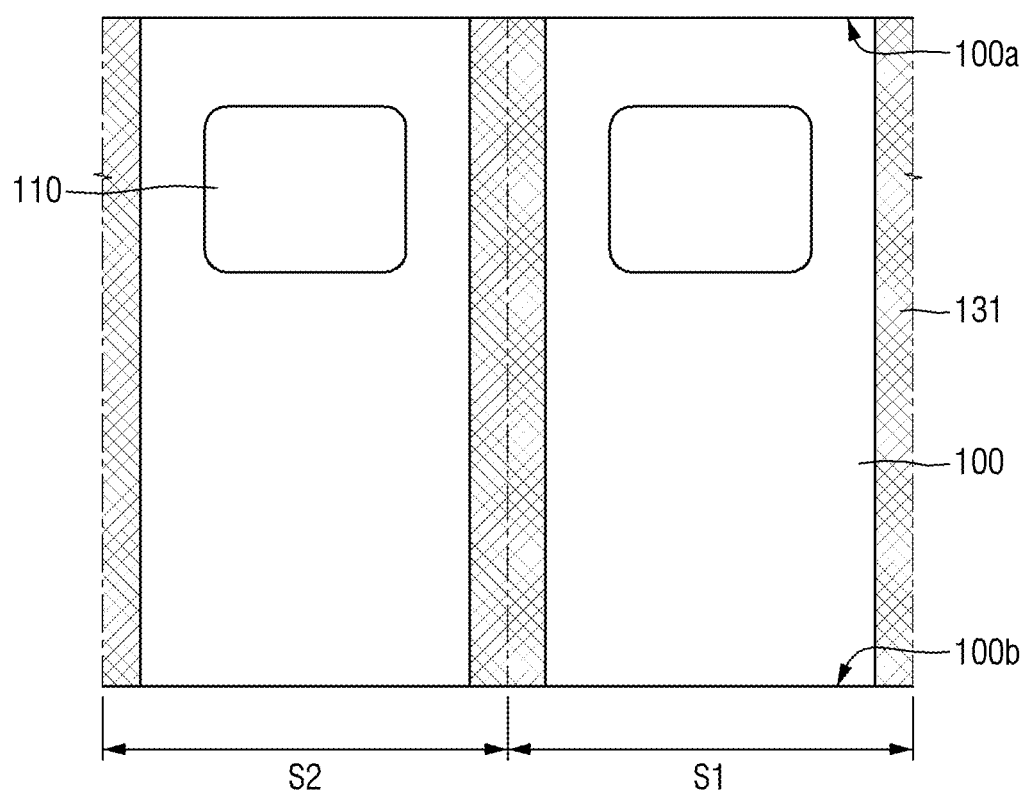

Referring to FIG. 27, the substrate 100 may be thinned to expose the isolation layer 131 and a second surface 100b of the substrate 100 that is opposite the first surface 100a.

Figure 28:
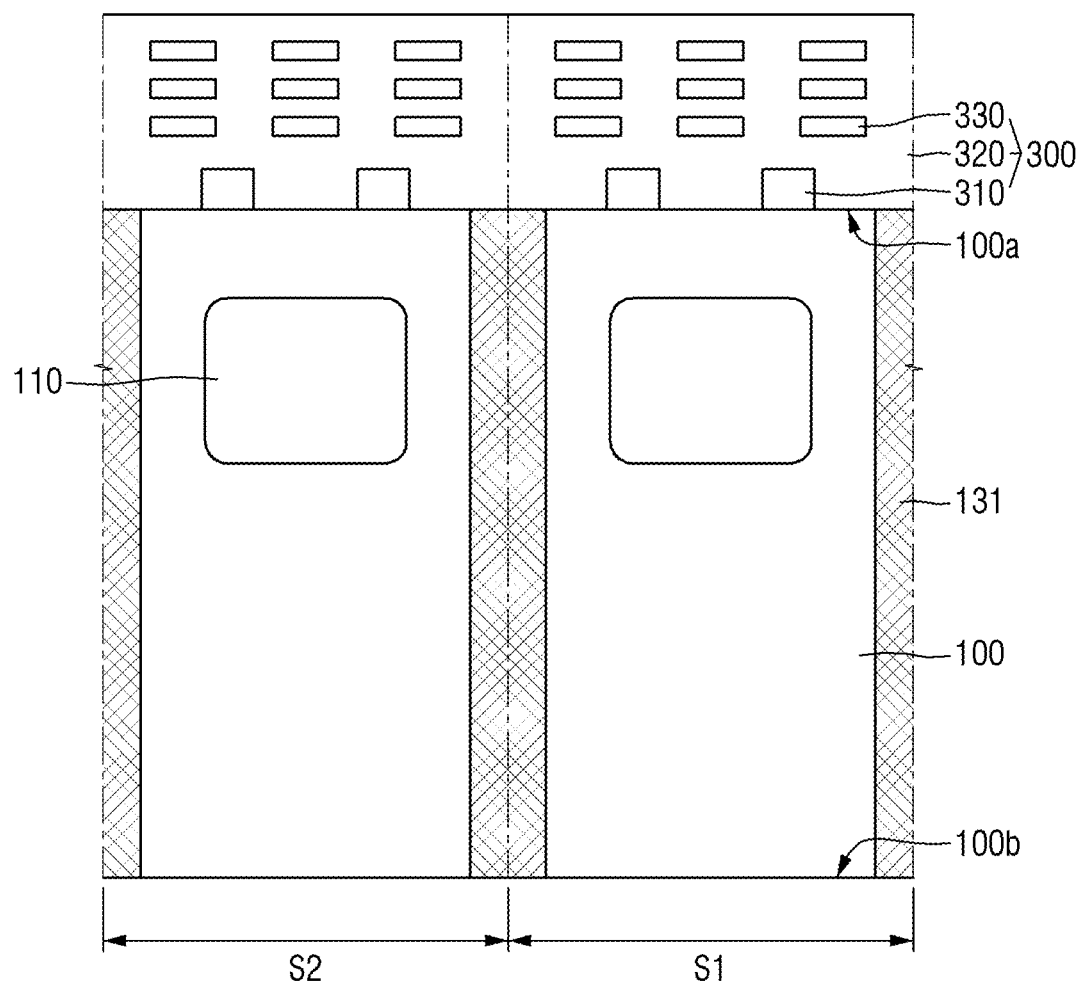

Referring to FIG. 28, the insulating structure 300 may be formed on the first surface of the substrate 100a.

Figure 29:
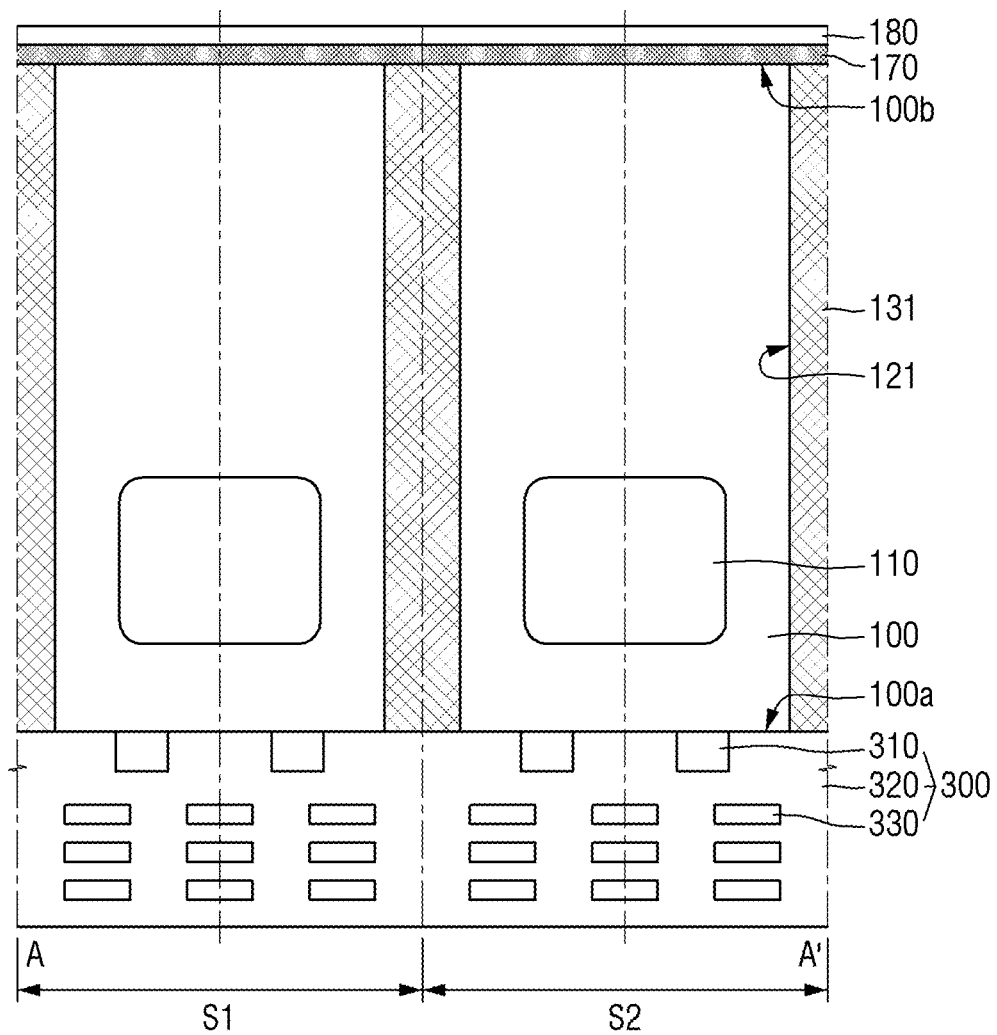

Referring to FIG. 29, the lower planarization layer 180 may be formed on the second surface 100b. Afterwards, the stack structure 200 and upper planarization layer 210 may be formed on the lower planarization layer 180 using processes similar to those described above in FIGS. 18 to 23. Then, the microlens 220 and protective layer 230 may be formed on the upper planarization layer 210. An anti-reflection film 170 may be formed on the second surface 100b before forming the lower planarization layer 180 and the lower planarization layer 180 may be formed on the anti-reflection film 170.

While inventive concepts have been particularly shown and described with reference to some example embodiments, it will be understood by those of ordinary skill in the art that various changes in form and details may be made therein without departing from the spirit and scope of inventive concepts as defined by the following claims.

What is claimed is:

1. An image sensor comprising:
a substrate;
a photoelectric element in the substrate;
a shield layer including a first opening having a first width;
a first layer including a second opening for guiding incident light on the shield layer;
a second layer disposed above the first layer; and
a microlens disposed above the second layer;
wherein the second layer is a planarization layer;
wherein a first end of the second opening has a second width;
wherein a second end of the second opening has a third width;
wherein the second width is different from the first width.

2. The image sensor of claim 1, wherein the second width is greater than the first width.

3. The image sensor of claim 2, wherein the third width is greater than the first width.

4. The image sensor of claim 3, wherein the second width is greater than the third with.

5. The image sensor of claim 2, wherein the first layer covers only a part of the shield layer without covering the first opening.

6. The image sensor of claim 5, wherein the first opening is filled with a transparent material.

7. The image sensor of claim 6, further comprising a lower planarization layer between the photoelectric element and the second layer.

8. The image sensor of claim 7, wherein the opening is a circular in a plane structure.

9. The image sensor of claim 7, wherein the first layer includes photoresist.

10. The image sensor comprising:
a first photoelectric element;
a second photoelectric element;
a first layer including a first opening and a second opening;
a second layer including a third opening and a fourth opening; and
a planarization layer disposed above the second layer;
wherein the second layer is disposed above the first layer;
wherein a distance between the first opening and the second opening is greater than a distance between the third opening and the fourth opening; and
wherein the first opening and the third opening are vertically aligned with the first photoelectric element and the second opening and the fourth opening are vertically aligned the second photoelectric element.

11. The image sensor of claim 10, wherein a width of a first end of the third opening is greater than a width of the first opening.

12. The image sensor of claim 11, wherein a width of a second end of the third opening is greater than the width of the first opening.

13. The image sensor of claim 12, wherein the width of the first end of the third opening is greater than the width of the second end of the third opening.

14. The image sensor of claim 13, wherein the second layer covers only a part of the first layer without covering the first opening and the second opening.

15. The image sensor of claim 14, wherein the first opening is filled with a transparent material.

16. The image sensor of claim 15, wherein the opening is a circular in the plan structure.

17. The image sensor comprising:
a substrate;
a photoelectric element in the substrate;
a lower planarization layer disposed above the photoelectric element;
a first layer comprising a first opening for guiding incident light on the shield layer;
an upper planarization layer disposed above the first layer; and
a microlens disposed above the second layer;
wherein a width of a first end of the first opening is greater than a width of a second end of the first opening.

18. The image sensor of claim 16, wherein the first layer includes photoresist.

19. The image sensor of claim 15, wherein the second layer includes photoresist.

* * * * *